United States Patent
Bischoff et al.

(10) Patent No.: US 11,817,290 B2
(45) Date of Patent: *Nov. 14, 2023

(54) METHOD, DEVICE AND SYSTEM FOR REDUCING OFF-AXIAL ABERRATION IN ELECTRON MICROSCOPY

(71) Applicant: FEI Company, Hillsboro, OR (US)

(72) Inventors: Maarten Bischoff, Uden (NL); Peter Christiaan Tiemeijer, Eindhoven (NL); Tjerk Gerrit Spanjer, Eindhoven (NL); Stan Johan Pieter Konings, Breda (NL)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/159,261

(22) Filed: Jan. 25, 2023

(65) Prior Publication Data

US 2023/0223231 A1 Jul. 13, 2023

Related U.S. Application Data

(63) Continuation of application No. 17/253,097, filed as application No. PCT/US2018/066790 on Dec. 20, 2018, now Pat. No. 11,587,759.

(30) Foreign Application Priority Data

Dec. 28, 2017 (EP) .................................. 17210806

(51) Int. Cl.
*H01J 37/153* (2006.01)
*H01J 37/147* (2006.01)
(Continued)

(52) U.S. Cl.
CPC ........ *H01J 37/153* (2013.01); *H01J 37/1478* (2013.01); *H01J 37/20* (2013.01);
(Continued)

(58) Field of Classification Search
CPC ...... H01J 37/00; H01J 37/153; H01J 37/1478; H01J 37/20; H01J 37/222; H01J 37/26;
(Continued)

(56) References Cited

U.S. PATENT DOCUMENTS

| 4,101,813 A | 7/1978 | Parker et al. |
| 5,371,371 A | 12/1994 | Yamazaki et al. |

(Continued)

FOREIGN PATENT DOCUMENTS

JP 2014053074 A 3/2014

OTHER PUBLICATIONS

Glaeser, Robert M., et al., "Precise beam-tilt alignment and collimation are required to minimize the phase error associated with coma in high-resolution cryo-EM," Journal of Structural Biology, Dec. 15, 2010, vol. 174, No. 1, pp. 1-10.

(Continued)

*Primary Examiner* — Jason L McCormack
(74) *Attorney, Agent, or Firm* — Thomas F. Cooney

(57) ABSTRACT

A method for electron microscopy comprises: adjusting at least one of an electron beam and an image beam in such a way that off-axial aberrations inflicted on at least one of the electron beam and the image beam are minimized, the adjusting performed by using a beam adjusting component to obtain at least one modified image beam, wherein the adjusting comprises applying both shifting and tilting to at least one of the electron beam and the image beam and wherein the amount of tilting of at least one of the electron beam and the image beam depends on the amount of shifting of at least one of the electron beam and the image beam respectively and wherein the amount of tilting is computed based on at least one of coma and astigmatism introduced as a consequence of the shift.

9 Claims, 8 Drawing Sheets

(51) Int. Cl.
  *H01J 37/20* (2006.01)
  *H01J 37/22* (2006.01)
  *H01J 37/28* (2006.01)

(52) U.S. Cl.
  CPC ............ *H01J 37/222* (2013.01); *H01J 37/28* (2013.01); *H01J 2237/1516* (2013.01); *H01J 2237/1534* (2013.01); *H01J 2237/202* (2013.01); *H01J 2237/221* (2013.01); *H01J 2237/2802* (2013.01)

(58) Field of Classification Search
  CPC ............... H01J 37/28; H01J 2237/1516; H01J 2237/1534; H01J 2237/202; H01J 2237/221; H01J 2237/2802
  USPC .......................................... 250/306, 307, 311
  See application file for complete search history.

(56) References Cited

U.S. PATENT DOCUMENTS

| | | | |
|---|---|---|---|
| 11,587,759 B2* | 2/2023 | Bischoff | H01J 37/153 |
| 2001/0010357 A1 | 8/2001 | Ose et al. | |
| 2005/0236570 A1* | 10/2005 | Morokuma | H01J 37/153 |
| | | | 250/311 |
| 2006/0108909 A1 | 5/2006 | Sato | |
| 2009/0322973 A1 | 12/2009 | Ito et al. | |
| 2010/0213369 A1 | 8/2010 | Zach et al. | |
| 2015/0029593 A1* | 1/2015 | Sawada | G01N 23/20 |
| | | | 359/637 |
| 2015/0348738 A1* | 12/2015 | Zeidler | H01J 37/10 |
| | | | 250/396 R |
| 2016/0351371 A1 | 12/2016 | Li et al. | |
| 2017/0236681 A1 | 8/2017 | Morishita | |

OTHER PUBLICATIONS

John M Rodenburg: "Understanding Transmission Electron Microscope Alignment: A Tutorial", Microscopy and Analysis, John Wiley & Sons Ltd, United Kingdom, vol. 18, No. 3, May 8, 2004 (May 8, 2004), pp. 9-11.

PCT/US2018/066790, International Search Report and Written Opinion, dated Apr. 5, 2019, 4 pages.

Tromp R M et al: "A simple energy filter for low energy electron microscopy/photoelectron emission microscopy instruments", Journal of Physics: Condensed Matter, Institute of Physics Publishing, Bristol, GB, vol. 21, No. 31, Aug. 5, 2009 (Aug. 5, 2009), p. 314007.

* cited by examiner

METHOD, DEVICE AND SYSTEM FOR REDUCING OFF-AXIAL ABERRATION IN ELECTRON MICROSCOPY

CROSS REFERENCE TO RELATED APPLICATION

This application is a Continuation of co-pending and co-assigned U.S. application Ser. No. 17/253,097, now U.S. Pat. No. _____, having a 371(c) date of Dec. 16, 2020, which is the U.S. National Stage of international application No. PCT/US2018/066790, now abandoned, having an international filing date of Dec. 20, 2018, which claims foreign priority to European application No. 17210806.0, now abandoned, which was filed on Dec. 28, 2017, the disclosures of which are hereby incorporated herein by reference in their entirety.

FIELD

The invention relates to a method for performing electron microscopy. More specifically, the invention relates to minimizing aberration, preferably off-axial aberration in electron microscopy, such as TEM (Transmission Electron Microscopy), Scanning Electron Microscope (SEM) and STEM (Scanning Transmission Electron Microscopy). The invention also concerns a device and a system for minimizing aberration, preferably off-axial aberration in electron microscopy, particularly configured to automated microscopic image reconstruction and/or segmentation.

INTRODUCTION

The development of electron and scanning probe microscopies in the second half of the twentieth century has produced spectacular images of the internal structure and composition of matter with nanometer, molecular, and atomic resolution. Largely, this progress was enabled by computer-assisted methods of microscope operation, data acquisition, and analysis. Advances in imaging technology in the beginning of the twenty-first century have opened the proverbial floodgates on the availability of high-veracity information on structure and functionality. From the hardware perspective, high-resolution imaging methods now routinely resolve atomic positions with sub-Angstrom precision, allowing insight in the atomic structure and dynamics of materials.

Various kinds of microscopy can be relevant for the present invention, such as electron microscopy, charged-particle microscopy, Transmission Electron Microscope (TEM), Scanning Electron Microscope (SEM), and Scanning Transmission Electron Microscope (STEM), and also various sub-species, such as so-called "dual-beam" tools (e.g. a FIB-SEM), which additionally employ a Focused Ion Beam (FIB), allowing supportive activities such as ion-beam milling or Ion-Beam-Induced Deposition (IBID) or ion based imaging. This is a non-exclusive list of high performance microscopy approaches.

More specifically, in a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.

In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the electron beam over the specimen.

More information on some of the topics elucidated here can, for example, be gleaned from the following Wikipedia links:
    http://en.wikipedia.org/wiki/Electron_microscope
    http://en.wikipedia.org/wiki/Scanning_electron_microscope
    http://en.wikipedia.org/wiki/Transmission_electron_microscopy
    http://en.wikipedia.org/wiki/Scanning_transmission_electron_microscopy Although various forms of scanning microscopy have been known for decades, they have a common shortcoming that is starting to manifest itself as a bottleneck in many areas of science and technology. This shortcoming has to do with the fact that electron microscopy imaging tends to be a relatively slow and tedious process, which has therefore traditionally been limited to investigating very small (portions of) specimens, e.g. on a typical scale of tens of nanometers in Charged Particle Microscopes and tens of microns in confocal microscopy. Yet, in many areas of human endeavor, there is an increasing need to maintain the resolution offered by these techniques, but to expand their imaging areas by orders of magnitude. For example: in cellular biology, there is a desire to expand cellular-level imaging to the tissue level, e.g. so as to more clearly investigate the interaction between (different types of) cells, particularly in brain tissue, muscle tissue, neoplasms (cancer tissue), etc.

In mineralogy/petrology, there is a need to expand analyses at molecular level to the level of grains and grain boundaries, e.g. so as to more clearly investigate gas trapping behavior in stone matrix material in tracking studies, precious metal encapsulation in quartz formations, unwanted inclusions in synthetic gems and other crystals, etc.

In the semiconductor industry, there is a desire to expand investigations at the level of individual junctions to a broader qualification of entire devices and arrays of devices, e.g. as when performing quality control vis-a-vis critical dimension, overlay, contamination, etc.

However, extending current electron microscopy techniques to such large imaging scales would entail such hugely augmented image accumulation times as to basically render such extension untenable. Therefore, despite great desire and need, current techniques are so impractical as to exclude themselves from realistic applicability in this regard.

This problem can be tackled by changing imaging techniques in electron microscopy, and, more specifically, in STEM and/or TEM. Typically, large shifts of the beam and image beam can lead to large aberration in the resulting images. For example, in TEM, this results in longer throughput times for sample imaging, since stage shifts need to be done fairly often, and take a long time to achieve. In STEM, large field images are taken, resulting in large aberrations on the edges of the images. The two problems can be addressed simultaneously, by providing a method and a device for achieving large image/beam shifts while maintaining image resolution.

The resolution and field of view obtainable in electron beam instruments such as scanning electron microscopes, electron beam microprobes and electron beam lithographic machines is limited by aberrations of the optical system. These aberrations can be classified as parasitic and intrinsic. Parasitic aberrations are caused by imperfections of the lens, such as imperfect roundness or inhomogeneities in the magnetic properties of the material generating the magnetic field of the lens. The most well-known parasitic aberration of a lens is (two-fold) astigmatism. Intrinsic aberrations are intrinsic to the lens, and, therefore, they cannot be avoided by careful machining. Intrinsic aberrations are conventionally classified as purely geometric (of which the most well-known aberration is spherical aberration) or energy-dependent (of which the most well-known aberration is the (first order) chromatic aberration). An electron beam instrument is one which produces an electron beam directed along an axis, has a focusing lens and means for scanning the focused beam. The intrinsic geometric aberrations of third-order of a lens are of eight types: isotropic and anisotropic distortion, curvature of field, isotropic and an isotropic off-axial astigmatism, isotropic and anisotropic off-axial coma, and spherical aberration. The words "off-axial" are used to distinguish the off-axial astigmatism and off-axial coma (which are intrinsic aberrations and which are third order) from the on-axial astigmatism and on-axial coma (which are parasitic aberrations and first and second order, respectively). It should be noted, that the words "off-axial" and "on-axial" are often dropped when it is clear from the context which form of astigmatism or coma is meant.

For an image point on the optical axis of the system, only spherical aberration occurs. As the electron beam is focused onto image points farther off axis, the remaining seven aberrations become significant in determining the attainable focused spot size and the degree of distortion present in the image.

Several of these optical aberrations can be corrected with commonly known techniques. The only aberrations which limit the field of view for which some sort of simultaneous correction has not been provided are isotropic and anisotropic coma. As is commonly known, proper placement of the beam defining aperture enables isotropic coma to be cancelled, even in non-scanning electron beam instruments such as the conventional electron microscope. There has been, however, no means of completely correcting the anisotropic coma aberration. Further, the simultaneous correction of anisotropic and isotropic coma while minimizing curvature of field is an issue.

Several use cases exist in transmission electron microscopy (TEM) in which the electron beam is moved or scanned over the specimen. This shift typically introduces coma and astigmatism.

One example is Single Particle Analysis (SPA). In this workflow, the specimen contains a grid with many circular holes each containing a foil of ice with copies of the molecule to be imaged. Each ice foil is about 2 μm diameter, and the foils are at a pitch of about 5 μm. The stage moves to the center of the hole, and 2 to 6 different beam-image shifts of ca. 0.5 μm are used to acquire 2 to 6 images, each image covering an area of ca. 0.5×0.5 μm². In this context, a beam-image shift means combined deflection of the illuminating beam above the specimen and of the image beam below the specimen, such that, after the double deflection, the beam is on-axis in the imaging system downstream of the specimen, and such that a part of the specimen is imaged which is not on-axis. Then the stage moves to the next hole (which is typically 5 μm away) and the procedure is repeated. This process may be repeated thousands of times, thus generating many thousands of images. From these images the particles are picked, classified, aligned, and averaged to come to a certain resolution in the reconstructed particle. An acquisition session can typically take several days.

The relaxation time of a stage shift is approximately 1 minute and this waiting time is the dominating contribution to the total time of a SPA session. This total time could be significantly reduced if instead of using stage shifts, beam-image shifts could be used. However, beam-image shifts larger than ~1 μm cannot be used since this would introduce too much off-axial aberrations (especially, off-axial coma and off-axial astigmatism) and would deteriorate the resolution.

Therefore, the total time of the SPA workflow could be significantly reduced if larger coma-free and astigmatism-free beam-image shifts could be realized.

Another example is for example tomography. When the specimen is tilted, then, due to mechanical imperfections in the specimen stage, the specimen can, apart from the intended tilt, also experience an unintended shift. This unintended shift may be in the order of ca. 2 μm. In order to re-center the area-of-interest, the stage may be shifted, but, more preferably (because of time constraints), the image can be shifted using a beam-image shift.

Another example is Scanning Transmission Electron Microscopy (STEM) in which the beam is scanned over the specimen. Here, when scanning large field of views with high resolution, scan coma can already limit the contrast and resolution at the corners of the field of view.

This may be exemplified by the following numbers: the best resolution that a 300 kV STEM microscope (without inbuilt spherical aberration corrector) can give is about 0.10 nm. Typically, this is obtained by scanning the specimen in pixels of about 0.04×0.04 nm². Modern STEM controls can collect images as large as 8000×8000 pixels. This corresponds to a field-of-view of 320×320 nm² and a maximum off-axial distance of u=320 nm/√2=226 nm. The blur due to off-axial coma can be calculated as $$du = \overline{K}uvv + 2Kuv\bar{v}$$

where K denotes the coefficient of off-axial coma and v denotes the half-convergence angle of the STEM beam at the sample. Here distance and angle and coma are complex numbers $u=x+iy$ and $v=\alpha_x+i\alpha_y$ and their complex conjugates are denoted by an added top bar. Since K is typically about 1 (dimensionless) and v is typically 0.012 rad, the off-axial blur in the corners of the image amounts to about 0.098 nm in this example, which degrades the resolution.

In order to understand the nature of the off-axial aberrations, it can be helpful to simplify the objective lens as to be an infinitely thin lens. Ideally, the refractive strength of the lens increases linearly with the distance of the beam to the center of the lens; the associated constant of proportionality equals the inverse focal distance of the objective lens. However, in practice, higher order aberrations cause that the refractive strength deviates from the linear dependence. However, for the infinitely thin lens, any beam that is directed through the center of the lens will not suffer from these higher order aberrations since the refractive power of the lens is zero at its center. Thus, it is possible to scan the sample indefinitely far off-axis without inflicting higher order aberrations to the beam, provided the scanning beam is tilted (or directed) such that it travels through the center of the objective lens. This scheme is known to the skilled person as 'putting the pivot-point in the coma-free plane'.

Similarly, for a real, not infinitely thin lens, there is exist a plane, usually fairly close to the center of the lens with the property that no isotropic off-axial coma is introduced when the scanning beam is directed such that it crosses the optical-axis in this plane.

By using a complex pivot point, i.e. adding a shift-dependent tilt correction to the shift, not only the isotropic but also the anisotropic coma can be avoided or corrected.

U.S. Pat. No. 4,101,813 describes a double deflection scanning system for electron beam instruments embodying a means of correcting isotropic coma, and anisotropic coma aberrations induced by the magnetic lens of such an instrument. The scanning system deflects the beam prior to entry into the magnetic lens from the normal on-axis intersection of the beam with the lens according to predetermined formulas and thereby reduces the aberrations.

In fact, this method is used in STEM microscopes with inbuilt correctors for spherical aberration of the probe forming objective lens. On uncorrected microscopes, this method has never been implemented so far. Furthermore, this method could also be used to minimize scan coma to enable larger field of views in STEM imaging without deteriorating the resolution.

All patent and non-patent literature cited before and the citations contained therein are incorporated herein by reference.

SUMMARY

In light of the above, it is the object of the present invention to provide a method, a device and a system for minimizing aberration, preferably off-axial aberration in electron microscopy.

This object is attained with the subject matter according to the claims.

The present invention can allow for much increased productivity in life science TEM workflows, especially for life science microscopes, which do not have a spherical aberration corrector. For such low-costs and easy-to-operate microscopes it can increase the range of allowed beam/image shift to a level comparable or even surpassing that of present microscopes with inbuilt corrector. The invention can also yield the ability of applying coma-free image beam shifts while keeping the diffraction pattern stationary on a phase plate. Furthermore, the invention can provide the ability of applying coma-free scans while keeping the diffraction pattern stationary on STEM detectors.

In a first embodiment, a method for electron microscopy is disclosed. The method comprises providing an electron microscope comprising a sample component, at least one beam generator, at least one adjusting component and at least one diffraction correcting component. The method further comprises securing a sample by using the sample component. The method also comprises generating an electron beam by using the beam generator. The method further comprises generating an image beam by directing the beam to the sample component. The method also comprises adjusting at least one of the beam and the image beam by using the adjusting component to obtain at least one modified image beam. The adjusting is performed in such a way, that off-axial aberrations inflicted on at least one of the beam and the image beam are minimized. The method further comprises correcting a diffraction pattern in the modified image beam by using the diffraction correcting component.

The present method can preferably be used in Scanning transmission electron microscopy (STEM) and/or in Transmission electron microscopy (TEM). The sample component can comprise a specimen plate or a similar known piece of equipment configured to hold a sample and/or a specimen. The beam generator can comprise, for example, an electron gun. The adjusting component and diffraction correcting component are further described below.

The present method is directed towards reducing aberrations, particularly off-center aberrations due to large shifts and/or tilts of the beam before and/or after reaching the sample. This advantageously allows to apply larger adjustments (that is, shifts and/or tilts) to different stages of the beam while still obtaining sample images that are in focus and with minimal aberrations. In STEM, the method advantageously allows for larger field of view without loss of sharpness at its edges. In TEM, the method advantageously allows for reducing sample throughput time due to applying more shifts and tilts to the beam as opposed to moving the stage.

Note, that, as used herein, the term "beam" refers to the electron beam emitted by the beam generator before it reaches the sample component (that is, before any interaction between the electrons constituting the electron beam and the sample occurs). In other words, the term "beam" refers herein to "probe forming beam" in STEM and to "illuminating beam" in TEM. Also note that the term "beam" is sometimes referred to as "electron beam". These two are used interchangeably in the present disclosure.

The term "image beam" refers herein to "emanating beam", "diffraction pattern forming beam" and/or "scattered/unscattered beam" in STEM, and to "image forming beam" in TEM. Furthermore, "image beam" is used here as the beam that has interacted with the constituents of the sample, but has not been further adjusted yet. That is, the image beam is the part of the beam that has not been tilted and/or shifted after interacting with the sample. The term "modified image beam" refers to the part of the electron beam that has been adjusted. That is, this is the resulting beam after tilting and/or shifting applied to either the beam, the image beam and/or (preferably) both of them.

For reference, the term "image" itself, refers herein to the image that follows from combining the intensities as recorded on the STEM detector pixel-by-pixel in STEM, and to the intensity of the beam at the image plane (the plane on which the sample is imaged by the various lenses downstream of the specimen) in TEM.

The correction of off-axial aberrations inflicted on the beam and/or the image beam can be performed as follows. In TEM, off-axial aberrations are generated in the lens below the sample. In STEM, the off-axial aberrations are generated in the lens above the sample. That is, in STEM, the image resolution is only affected by the aberrations that occur upstream the specimen, because the resolution in STEM is determined by the size of the probe on the sample, and, therefore the aberrations of the beam just in front of the sample are minimized.

In most TEM/STEM microscopes, the sample is placed between two objective lenses, one in front of the sample, and one after the sample. The objective lens in front of the sample is the probe forming lens in STEM and the aberrations of this lens need to be minimized for optimal STEM resolution. The off-axial coma of this lens can be minimized by directing the beam through the complex pivot point (that is, one resulting in skew illumination) in the coma-free plane of this first lens.

The objective lens after the sample is the first imaging lens in TEM and the aberrations of this lens need to be minimized for optimal TEM resolution. The off-axial coma of this lens can be minimized by directing the beam through the complex pivot point in the coma-free plane of this second lens. In other words, the off-axial aberrations due to the adjustment (which preferably comprises shift and tilt) of the beam and/or the image beam are minimized in the resulting image. That is, the resolution and/or focus of the resulting image is improved.

Further, note that the infliction of off-axial aberrations is generally due at least partially on the adjusting of the beam and/or the image beam itself. That is, the adjustment is done in such a way that compensates for this effect. For example, in the case where the adjustment comprises a large shift of the beam, this can result in an image with reduced resolution. Foreseeing this effect, the adjustment can include a tilt of the image beam resulting in a compensation to the off-axial aberrations.

In some embodiments, adjusting at least one of the beam and the image beam by the adjusting component can comprise at least one of shifting and tilting at least one of the beam and the image beam respectively.

In some such embodiments, both shifting and tilting can be applied to at least one of the beam and the image beam and wherein the amount of tilting of at least one of the beam and the image beam depends on the amount of shifting of at least one of the beam and the image beam respectively.

In some such embodiments, the amount of tilting can be computed based on at least one of coma and astigmatism introduced as a consequence of the shift.

It should be noted, that a tilt of the image beam in the image plane is equivalent to a shift of the beam in the diffraction plane. Conversely, a shift in the image plane is equivalent to a tilt in the diffraction plane. Furthermore, the diffraction plane corresponds to a back focal plane of the objective lens, which essentially corresponds to a Fourier transform of the image plane.

In some embodiments, the adjusting component can comprise at least one pair of deflectors, preferably two pairs of deflectors, the pairs of deflectors configured to deflect the electrons comprising at least one of the beam and the image beam. Here, a pair of deflectors is understood as a set of two deflectors, with one deflector (the 'x' deflector) deflecting the beam perpendicular to the optical axis (understood to be in the 'z' direction) and the other deflector (the 'y' deflector) deflecting the beam in a different direction perpendicular to the optical axis. That is, the adjusting component can apply a shift and/or a tilt to the beam and/or to the image beam. The deflectors are preferably configured in such a way that one pair lie in one plane, and a second pair lies in a second plane. The two pairs of deflectors can then be excited in such a way so as to allow any deflection at any apparent pivot point.

In some embodiments, the adjusting can comprise at least shifting of up to 3 μm, preferably up to 5 μm, even more preferably up to 10 μm of at least one of the beam and image beam. As described above, this corresponds to a larger than typical shifting in STEM and/or TEM. This advantageously allows for more accurate measurement results and/or reduced time for measurement acquisition.

In some embodiments, the adjusting can comprise shifting and tilting the beam and the image beam. This can be done so that the shift of the image beam is substantially equal and opposite to the shift of the beam and the tilt of the image beam is substantially equal and opposite to the tilt of the beam. In other words, the beam is first shifted and tilted so that a part of the specimen lying off the central optical axis can be imaged, and then, having interacted with the specimen, shifted and tilted in the opposite way, so that it returns to the optical axis.

The diffraction correcting component can comprise a double pair of deflectors. Those can be the same deflectors that can comprise the adjusting component. In STEM, it can be beneficial to keep the diffraction pattern stationary while scanning. In this case, the diffraction correcting component can simply comprise two pairs of deflectors, which can be arranged as described above.

In some embodiments, the diffraction correcting component can comprise an additional lens. In some such embodiments, the additional lens can be configured to generate a magnified diffraction pattern. In some such embodiments, the diffraction correcting component can further comprise a double deflector unit. In some such embodiments, the double deflector unit can be configured to de-tilt at least one of the image beam and the modified image beam before the (magnified) diffraction pattern. This configuration of the diffraction correcting component can be particularly advantageous in TEM, and especially when life science samples are imaged, which, by their nature, give only little contrast. This is because in TEM, contrast can be boosted by placing a phase shifting device (such as a phase plate) in the central (undiffracted) beam in the diffraction pattern, but this requires that the diffraction pattern is essentially stationary on the phase shifting device, and, preferably, that the diffraction pattern has a large size comparable to the size with which phase shifting devices can be manufactured. In order to have a stationary diffraction pattern, the image beam must be de-tilted before the phase shifting device. In conventional TEM, only the (first) back focal plane contains a diffraction pattern of sufficiently large size to match the physical size of the phase shifting device. However, de-tilting by using two pairs of deflectors cannot be done, since there is insufficient space to position deflectors between the sample component and the back focal plane of objective lens where the diffraction plane is roughly located. The additional lens can be used to make a magnified diffraction pattern between the extra lens and the projector system, so that the diffraction aperture or phase plate can be inserted into the new diffraction plane. Thus, sufficient space is created to enable the positioning of two pairs of deflectors between the sample component and the phase shifting device.

In some such embodiments, the double deflector unit can be configured to shift and tilt the modified image beam in a substantially equal and opposite way from the shifting and/or tilting of the beam and the image beam respectively. As mentioned above, this is particularly advantageous for returning the modified image beam to the optical axis, especially to the centre of the phase shifting device.

In some embodiments, adjusting at least one of the beam and image beam and correcting a diffraction pattern is performed by the same component comprising at least one double deflector unit. In other words, while the adjusting component and the diffraction correcting component can comprise different constituents, they can also be the same components used in two different ways.

In some embodiments, correcting the diffraction pattern in the modified image beam can comprise tilting the modified image beam to center the diffraction pattern. That is, correcting can comprise only the tilting to return to the optical axis.

In some embodiments, the method can be used to improve at least one of contrast and resolution in scanning transmission electron microscopy. As described above and below, this can be achieved by allowing to scan large field of view with high resolution and correcting the scan coma at the edges of the field of view.

In some such embodiments (that is, the STEM-specific implementation), the adjusting component can comprise quadrupoles. The electrostatic quadrupoles can reduce astigmatism created by shifting at least one of the beam and image beam. The quadrupoles can be generated electrostatically or magnetically. Magnetic generation is mostly used in SEM and STEM because it is easier to construct. Electrostatic is used in FIB and sometimes in SEM. Electrostatic is preferably not used in STEM, because STEM is done at higher accelerating voltages, which would require rather high voltages on the quadrupoles.

However, magnetic quadrupoles are relatively slow because of magnetic self-induction and Eddy currents. Therefore, if the quadrupoles must be adjusted during the scan, then electrostatic is the logical thing to perform. However, if the large shift is only applied between different STEM acquisitions at different positions off-axis, then the quadrupoles do not need to be adjusted during the scan, and magnetic quadrupoles are the easiest implementation.

In some such embodiments (that is, the STEM-specific implementation), the diffraction correcting component can comprise scan coils. In such embodiments, the method can further comprise using scan coils to tilt the beam before directing it to the sample component and de-tilting the image beam below the sample component.

In some embodiments, the method can be used to reduce throughput time in a sample image acquisition session in transmission electron microscopy. This can be achieved by employing more large beam and image beam shifts, which are then compensated by tilts to reduce the induced additional aberration.

In another embodiment, use of the method according to any of the described method embodiments to improve at least one of contrast and resolution in tomography is disclosed.

In another embodiment, use of the method according to any of the preceding method embodiments on electron microscopes without inbuilt spherical aberration correction is disclosed. This is the preferred implementation of the invention, since in microscopes with inbuilt spherical aberration corrector, tilting the beam to generate an effective coma to compensate the intrinsic off-axial coma is not possible. Note, that in case of STEM, the aberrations of the probe-forming part (that is, all lenses upstream the sample) are relevant for the invention. Thus, in case of STEM, the invention is only relevant in case of absence of probe-spherical aberration, irrespective of whether the microscope has a spherical aberration corrector for TEM downstream of the sample.

In a second embodiment, a method for reducing throughput time in a sample image acquisition session in transmission electron microscopy is disclosed. The method comprises providing an electron microscope comprising a sample component, at least one beam generator, at least one adjusting component, and at least one filtering component. The method further comprises securing a sample by using the sample component. The method also comprises generating an electron beam by using the beam generator. The method further comprises generating an image beam by directing the beam to the sample component. The method also comprises adjusting at least one of the beam and the image beam by using the adjusting component to obtain at least one modified image beam. The adjusting is performed in such a way, that off-axial aberration of the modified image beam is minimized. The method further comprises filtering the modified image beam via the filtering component to reduce resolution-deteriorating effect of chromatic aberration on the modified image beam resulting from the adjusting of the at least one of the beam and the image beam.

The definitions and clarifications presented in connection with the first embodiment of the invention also apply here, particularly those relating specifically to transmission electron microscopy.

In some embodiments, the adjusting can be performed repeatedly to obtain a plurality of different modified image beams. That is, the beam and/or the image beam can be adjusted multiple times, in order to image different part of the sample or specimen. Adjusting as used herein does not comprise a stage shift, but rather includes adjustments to the beam and/or the image beam only (such as shifting and/or tilting either or both of them). Preferably, at least 10 different modified image beams (leading to different images) are obtained. Even more preferably, at least 20 different modified image beams are obtained, such as at least 25.

In some embodiments, adjusting at least one of the beam and the image beam by the adjusting component can comprise at least one of shifting and tilting at least one of the beam and the image beam respectively. This is particularly advantageous in TEM, since stage shifts (which are typically used to obtain a plurality of different images) have a rather long relaxation time, leading to increased image acquisition time and sample throughput. Therefore, achieving the same amount and quality of different images by primarily using beam and image beam tilts and shifts leads to tremendous improvement of throughput time in TEM.

In some such embodiments, adjusting can comprise at least one of a beam shift and an image shift as well as at least one of a beam tilt and an image tilt. In some such embodiments, the amount of tilt applied during adjusting is dependent on the amount of at least one of beam shift or image shift respectively and wherein the specific amount of tilt applied reduces off-axial coma of the modified image beam. In other words, the tilt applied to the beam and/or the image beam can be used specifically to reduce or compensate aberration due to the large amount of shift applied.

In some embodiments, the adjusting can comprises shifting and tilting the beam and the image beam (that is, shifting both the beam and the image beam and also tilting both of them). The shift of the image beam is then substantially equal and opposite to the shift of the beam and the tilt of the image beam is substantially equal and opposite to the tilt of the beam. In other words, the shift and tilt applied to the image beam can be specifically chosen in such a way that they cancel the previous shift and tilt applied to the beam. This is particularly advantageous, since it allows the beam to interact with the parts of the sample (located on the sample component) which are not on the optical axis, while still returning the image beam to the optical axis after it has passed through the sample. In other words, imaging of off-center parts of the sample while avoiding aberration resulting from the beam being off-center downstream the first imaging lens (or after the adjusting components) is possible.

In some embodiments, the method can be used to reduce sample throughput time in single particle analysis. In some such embodiments, the sample component comprises a grid with a plurality of apertures, each configured to receive a foil of ice with the sample.

In some such embodiments, wherein "stage shift" refers to physically moving the sample component so that another part of the sample can be imaged, the throughput time of sample image acquisition can be reduced by decreasing the number of stage shifts and increasing the number of at least one of beam and image shifts performed in the sample image acquisition session. As touched upon above, the relaxation time of a stage shift can be significantly greater than that of a beam and/or image beam shift. Therefore, decreasing the amount of stage shifts needed to image sufficient amount of the sample can lead to an overall time optimization for a TEM analysis session. The typical relaxation time of a stage shift can comprise 10 to 60 seconds for the sample component to settle (that is, to be completely stationary) due to, for example, the release of stress in the bearings. On the other hand, relaxation or settling time of a beam and/or beam image shift comprises about 0.1 to 1 second due to the settling time of the deflection fields.

In some such embodiments, the number of at least one of beam shifts and image shifts taken without applying a stage shift can comprise at least 10 shifts, preferably at least 20 shifts, such as at least 25 shifts. As also mentioned above, this can lead to significant improvements in sample throughput time. For example, without large beam/image beam shifts, typical time needed to acquire an image might be around 15 seconds (assuming one stage movement of about 30 seconds, 3 image shifts of about 1 second each and 3 exposures of about 4 seconds each). On the other hand, by using the present method of applying large shifts to the beam/image beam, time of about 6 seconds per image can be achieved (assuming 1 stage movement of about 30 seconds, 27 image shifts of about 1 second each and 27 exposures of about 4 seconds each). That is, significant improvement in image acquisition time can be achieved (including speed increase of up to 2.5 times).

In some embodiments, the method can further comprise increasing the distance of at least one of beam shifts and image shifts. "Increasing" refers here to an increase compared to typical shifts used in TEM, and, particularly in single particle analysis.

In some such embodiments, the distance of the at least one of beam shifts and image shifts can be increased by at least 2 times, preferably at least 3 times, more preferably at least 5 times as compared to standard single particle analysis shift distance of about 1-2 μm.

In some embodiments, the tilt t applied to the beam can be related to the shift s applied to the image beam as $t=-K \cdot s/C_s$, where K denotes off-axial coma and Cs denotes spherical aberration. Note, that in electron microscopes with inbuilt spherical aberration corrector this aspect cannot be implemented. When spherical aberration $C_s$ is corrected, the method of tilting the beam to generate an effective coma to compensate the intrinsic off-axial coma cannot be applied. This is because there is no such judicious choice of t to make the coma B zero in $B=C_s \bar{t}+\overline{Ks}$ because $C_s$ is zero, In some embodiments, the filtering component can comprise an electron energy filter. That is, the filtering component can be configured to only let through electrons that have experienced an energy loss below a certain threshold, specifically those that will lead to the resulting image being in focus. This can be particularly advantageous in single particle analysis, since SPA samples tend to scatter electrons inelastically, leading to an increased blur in a resulting image. The filtering component can allow for selecting of only those electrons that will yield a clear image.

In some such embodiments, the filtering component can filter out electrons with an energy loss above 10 eV, preferably above 5 eV, more preferably above 3 eV.

In a third embodiment, an electron microscope is disclosed. The electron microscope comprises a sample component configured to receive a sample. It also comprises at least one beam generator configured to generate an electron beam. The beam is configured to generate an image beam upon being directed to the sample component. The electron microscope further comprises at least one adjusting component configured to adjust at least one of the beam and the image beam to obtain at least one modified image beam. The adjusting component is further configured to minimize off-axial aberration inflicted to at least one of the beam and the image beam. The electron microscope also comprises at least one diffraction correcting component configured to correct a diffraction pattern in the modified image beam resulting from at least one of beam and image shifts.

The electron microscope can be preferably configured to carry out the method according to any of the method embodiments.

The electron microscope can be optimized for transmission electron microscopy and/or for scanning transmission electron microscopy. It can also further comprise other standard components of an electron microscope such as systems of lenses, image and/or phase plate and components guiding the electron beam. These are well known in the art and to the skilled person and are not further described in the present disclosure.

In some embodiments, the electron microscope can be configured for transmission electron microscopy, preferably for single particle analysis. In some such embodiments, the sample component can comprise a grid with a plurality of apertures configured to receive a foil of ice with the sample.

In some embodiments, the adjusting component can comprise at least one pair of deflectors configured to generate at least one electromagnetic field each. That is, the deflectors can be configured to deflect the beam and/or the image beam via the electromagnetic field.

In some such embodiments, the adjusting component can comprise at least one pair of deflectors, preferably two pairs of deflectors, the deflectors configured to deflect the electrons comprising at least one of the beam and the image beam. Two pairs of deflectors can be particularly advantageous to deflect the beam and/or the image beam in any way desired. Note, that deflecting can comprise shifting and/or tilting.

In some embodiments, the adjusting component can be configured to at least one of shift and tilt at least one of the beam and the image beam respectively.

In some embodiments, the adjusting component can comprise at least a pair of beam deflectors and a pair of image deflectors, each pair configured to at least one of shift and tilt the beam and the image beam respectively. That is, one pair of beam deflectors can be placed upstream of the sample component, and one pair of beam deflectors can be placed downstream of it.

In some embodiments, the adjusting component can be configured to apply at least one of a beam shift and an image shift as well as at least one of a beam tilt and an image tilt. That is, the adjusting component can apply both a shift and a tilt to either one of the beam and the image beam or to both of them.

In some embodiments, the adjusting component can be configured to apply a variable amount of tilt based on the amount of shift applied to at least one of the beam and the image beam. This is further discussed above in relation to the method embodiments. In brief, the tilt can be applied to the beam and/or the image beam to compensate for the shift necessary to image other parts of the sample.

In some such embodiments, the adjusting component can be configured to shift and tilt the beam and the image beam. The shift of the image beam is substantially equal and opposite to the shift of the beam and the tilt of the image beam is substantially equal and opposite to the tilt of the beam. The advantage of this is the ability to image a part of the sample located away from the optical center, and return the beam to the optical center after the interaction with the sample to reduce any additional aberrations due to beam deflection.

In some embodiments, the diffraction correcting component can comprise an additional lens and a double deflector unit. The lens can comprise an electromagnetic lens. In some such embodiments, the additional lens is configured to generate a magnified diffraction pattern. In some such embodiments, the double deflector unit can be configured to de-tilt the modified image beam. De-tilting the modified image beam can be advantageous, as it can allow for recentering of the diffraction pattern after the beam and/or the image beam have been tilted.

In some embodiments, the electron microscope can further comprise a filtering component configured to filter the modified image beam. This is particularly advantageous for TEM-specific embodiments, since it can allow for filtering of the electrons, which scattered inelastically after interacting with the sample (and therefore contributed to excessive blur of the resulting image).

In some embodiments, the filtering component can be configured to reduce resolution-deteriorating effect of chromatic aberration on the modified image beam. The chromatic aberration can cause a blur, reduced sharpness or background in the image because electrons with energy deviating from the nominal energy are imaged at the wrong position (that is, the positions in the image that not corresponding to the positions on the sample where they originate) in the image plane; the energy filter can filter out those electrons with deviating energy loss. Therefore, the effect of the energy filter is to reduce the resolution-deteriorating effect of the chromatic aberrations. The filter can further serve to filter electrons causing blur due to several chromatic aberrations: chromatic aberration Cc, isotropic chromatic magnification error Co, and anisotropic chromatic magnification error C.

In some such embodiments, the filtering component can comprise an electron energy filter. The filtering component can be configured to filter out electrons with an energy loss above 10 eV, preferably above 5 eV, more preferably above 3 eV. This can be particularly advantageous to keep the resolution loss roughly below 1 Å for an image beam shift of about 10 μm, as further detailed below. Note, that "energy loss" refers to the energy lost due to inelastic scattering with the constituents of the sample.

In some preferred embodiments, the electron microscope can be configured to operate without an inbuilt image corrector introducing a shift-dependent tilt to reduce off-axial coma. This is further detailed above in the description of method embodiments.

In a fourth embodiment, a non-transient computer-readable medium with a computer program for carrying out the method for transmission electron microscopy according to any of the preceding method embodiments is disclosed. That is, a software that is configured to carry out the method as described in the present disclosure is disclosed. The software can be configured to control an electron microscope as described above in the device embodiments.

There are two main reasons why the presently disclosed inventive method has not been implemented yet, particularly why the coma-free pivot point is difficult to achieve.

First, off-axial coma can be difficult to quantify: as is known to the skilled person, aberrations which are of odd order in beam angle (such as focus and astigmatism which are of first order, and spherical aberration which is of third order) are relatively easy to observe in standard TEM because these odd-ordered aberrations affect the so-called Thon rings in the Fourier transform of the image (Thon rings are rings or ellipses of zero intensity in the Fourier transform). Modern cameras and software enable the user to observe in real-time the Fourier transform of the TEM image, thus enabling the user to directly see and judge how the controls for focus and astigmatism need to be adjusted in order to optimize the image resolution. On the other hand, aberrations of even order in beam angle (such as on-axial and off-axial coma) do not affect the Thon rings. Therefore, there is no direct feedback to the user that could help to adjust possible controls for manipulating on-axial or off-axial coma. Instead, in order to quantify aberrations of even order in beam angle, a so-called Zemlin tableau must be recorded, that is, a series of TEM images, each taken with a different tilt angle of the incident beam applied. Then, each of the tilts induce different first order aberrations due to the interplay of these tilts with the higher order aberrations (such as on-axial coma). The pattern of these first order aberrations (as measured by dedicated software from the position and ellipticity of the Thon rings in the series of Fourier transforms of the series of TEM images) as function of the applied beam tilt can be fitted and analyzed to quantify all aberrations, including on-axial coma. In the last decade, such dedicated software has been developed for quantifying and consecutively nullifying aberrations in spherical aberration correctors, and, recently, other packages like the applicant's auto-CTF have become available for microscopes without inbuilt spherical aberration correctors.

The second reason is that the coma-free plane is typically not in the objective aperture plane or in the plane that is imaged in diffraction mode and which contains for example the STEM detectors or phase plates. In fact, on most microscopes, beam shift and image beam shift pivot points are aligned with the criterion that the diffraction pattern must be stationary.

In TEM, an extra lens and a double deflector between back focal plane objective lens and phase plate can be used to compensate beam tilts above the specimen.

The imaging systems of state-of-the-art TEMs typically have an objective lens and four projector lenses. One can sacrifice one of the four projector lenses for this in order to give up rotation free magnification series.

Typically, scanning electron or ion microscopes comprise two types of beam deflectors. The first type is mainly used for correcting possible mechanical misalignments in the column. This type has a relatively large range, high stability, and has a relatively long settling time of 1 ms to 100 ms. This first type can also be used to guide the beam off-axis to image parts of the sample, which are off-axis. The second type is mainly used for fast scanning of the beam as needed for the acquisition of STEM images. This second type has usually a smaller range, and a very fast response time up to 100 kHz. This first type is usually referred to as DC deflectors, and the second type is usually referred to as AC deflectors or scan deflectors. The scan deflectors require dedicated scan supplies capable of being programmed to generate scan patterns of varying size, orientation, resolution, and speed. The scan deflection can be generated with electric deflection fields or with magnetic deflection fields. Magnetic generation is mostly used in SEM and STEM because it is relatively easy to construct, though it requires scan coils with low self-inductance and that the scan coils are not surrounded by good-conducting material in order to minimize Eddy currents. Electric generation is used in FIB and sometimes in SEM. Electric generation is preferably not used in STEM, because STEM is done at higher accelerating voltages which would require rather high voltages on the scan electrodes. Note, that electric and electrostatic refer herein to the same concept and should be considered synonyms.

In STEM, scan deflectors below the specimen can be used (known as "de-scan coils") for keeping diffraction pattern stationary.

Putting the pivot point in the coma-free plane would have the negative side effect that the diffraction pattern will shift when making image beam shifts because the back-focal plane of the objective lens (which contains the diffraction pattern) generally does not coincide with the coma-free plane. As a consequence, the diffraction information will move over the detector or phase plate while scanning.

Both obstacles can be avoided nowadays.

The coma and astigmatism can be quantified with modern quantification methods and software such as applicant's auto-CTF for TEM, and similar methods for STEM: a beam tilt (v) generates coma (B). By using the above-mentioned quantification software algorithms, it is possible to quantify the amount of introduced coma (in nm) by applied beam tilt (in mrad), i.e. dB/dv. Similarly, it is possible to quantify the amount of introduced astigmatism A (in nm) by a certain change of stigmator current S, i.e. dA/dS.

When these above-mentioned quantification software algorithms are combined in a software method that shifts the beam or image beam over an N×N grid, the coma and astigmatism can be measured on each point of the grid. After this measurement, the variation of B and A as a function of beam/image beam shift X, Y is exactly known. It is assumed that the shift dependent coma and astigmatism is stable over (relatively) long time. From the abovementioned calibrations dB/dv and dA/dS, the beam/image beam shift dependent B and A can be corrected by applying suitable tilt and stigmator corrections.

Beam and image beam deflectors comprise both an upper and a lower pair of deflectors. By exciting the upper and lower deflectors with appropriate ratios (i.e. pivot points) pure shifts and tilts can be generated.

In a similar way, modern scan supplies (or "scan engines") can generate four scan signals for steering the upper X scan coil, upper Y scan coil, lower X scan coil and lower Y scan coil. Modern scan engines are able to generate the four scan signals with the appropriate ratios so that on the specimen level pure scans and pure tilts can be generated. Note that this capability of the scan engine to superpose a scan tilt on the scan shift was originally developed to enable so-called STEM precession in which the beam scans the sample, and, at every image pixel, the beam is conically tilted during the acquisition of the STEM signal. For making coma-free scans, this existing scan engine can be programmed in such a way that there is a scan-dependent tilt correction.

In a further embodiment for STEM, quadrupoles, preferably electrostatic quadrupoles, can be used to make scan-dependent stigmator corrections.

In state-of-the-art microscopes such as the applicant's "Titan" or "Themis" (S)TEM microscopes, there are also scan-coils below the specimen which can be used for "de-scanning" the beam, i.e. keeping the beam stationary at the image plane while scanning the beam on the specimen. These coils can also be used for "de-tilting" the beam in STEM mode. In this way, it is possible to make coma-free scans AND keeping the diffraction pattern stationary on a STEM detector (such as a Bright Field (BF), Dark Field (DF), High Angle Annular Dark Field (HAADF) detector or pixelated detector) or to keep the beam stationary on an EELS detector.

In TEM mode it is also desirable that the diffraction pattern is stationary. Especially when phase plates are used this is extremely critical. De-tilting as proposed for STEM mode is not possible in this case, since there are no deflectors between specimen plane and the back focal plane of the objective lens where the diffraction plane—and phase plate—is roughly located. An extra lens with a double deflector unit between the objective lens and the projector system can solve the problem of shifting diffraction patterns. The extra lens first of all can also be used to make a magnified diffraction pattern between the extra lens and the projector system. The diffraction aperture or phase plate can be inserted in this new diffraction plane. Furthermore, the extra double deflection unit can be used to "de-tilt" the shifts of the diffraction pattern while making coma-free image beam shifts.

Present projector systems consist of four lenses to obey four constraints: magnification, rotation-free, focused image, and focused cross-over.

In order to avoid increasing the number of lenses in the projector system (with a corresponding increase of costs of the microscope), it would make sense to put the diffraction aperture or phase plate below the first projector lens, and thus reducing the remaining projector to a three lens projector system, no longer satisfying the constraint of rotation-free imaging. This would allow coma-free shifts. The image rotations between magnifications that are introduced in this three lens projector system may be corrected for in the image processing software a posteriori. The quantification of coma and astigmatism can be used to compensate for the shift-induced coma and astigmatism.

The ability of modern scan engines can also be used to program these compensations in HW/FW. Moreover, the negative side effect of moving diffraction patterns can be mitigated by inserting an extra lens with double deflection unit between objective lens and plane where phase plate/objective aperture/STEM detectors are placed. Further, using scan coils below the specimen for making "de-tilts" can mitigate the negative side effect of moving diffraction patterns in STEM. All those measures or sets thereof can be combined as well.

Below follows a brief quantitative discussion of off-axial aberrations in transmission electron microscopy, particularly in single particle analysis.

In conventional SPA, the maximum image beam shift is set by the aberrations that are introduced by the intrinsic third-order aberrations of the objective lens. The third order aberrations are the relevant quantities, since first order aberrations correspond to (on-axial)astigmatism that can be corrected by a stigmator or a stigmating lens, and $2^{nd}$ order aberrations vanish, since the system is rotationally symmetric. The following equations quantitatively illustrate this. Denote position and angle at the specimen by the complex numbers $u=x+iy$ and $v=\alpha_x+i\alpha_y$, and denote their complex conjugates by an added top bar. The general expression for the shift induced by all third-order aberrations is:

$$du = C_s v v \bar{v} + \overline{K} u v v + 2 K u v \bar{v} + F \bar{u} u v + \Lambda u u \bar{v} + D u u \bar{u},$$

where $C_s$=spherical aberration, K=off-axial coma, F=field curvature, $\Lambda$=off-axial astigmatism (complex number), D=distortion.

Let us introduce a shift u→u+s and a tilt v→v+t at the specimen. This induces additional aberrations $$vvB + 2v\overline{v}B + df v + A\overline{v} + \text{higher order terms},$$

with effective coma $B = C_s \overline{t} + \overline{Ks}$ effective defocus $df = C_s 2t\overline{t} + 2\overline{st}K + 2\overline{Kst} + 2Ks\overline{t} + Fs\overline{s}$ effective astigmatism $A = C_s tt + 2Kst + \Lambda ss$ In conventional single particle analysis, no tilt is applied, only a shift s. In this case, the effective coma is limiting the maximum image beam shift.

In this case, when coma B reaches about 2 μm, it results in a resolution loss of about 1 Å, and this is the maximum resolution loss that is practically acceptable. Applicant's Krios™ transmission electron microscope comprises K=0.15+1.42i, so the maximum allowed image beam shift is about $$S = B/\overline{K} = 2 \ \mu m/(0.15 - 1.42i) \approx 1.5 \ \mu m.$$

The effective coma can be eliminated by simultaneously applying an image beam shift s and a beam tilt t with a ratio $t = -K \ s/C_s$. This skew illumination is known from U.S. Pat. No. 4,101,813.

A consequence of this skew illumination is that the beam no longer passes through the rotation center of the objective lens. This causes an image blur as explained in the following equations.

The general expression for all first-order chromatic aberrations is:

$$du = dE/E(C_c v + Cu)$$

with $C_c$=chromatic aberration and $C = C_D + iC_\Theta$=magnification error.

Then, the shift s with skew tilt $t = -K \ s/C_s$ is applied. This induces the additional chromatic blur $$du = dE/E(-KC_c/C_s + C)s$$

The number $-K \ C_c/C_s + C$ is generally not zero and is on the order of one. Thus, (very coarsely): du~dE/E×s.

If the specimen scatters only elastically, then dE equals the energy spread in the source, thus dE=0.7 eV. Then, E=300 keV and s=10 μm gives $$du \sim 0.7 \ eV/300 \ keV \times 10 \ \mu m = 0.2 \ \text{Å}.$$

This blur is negligible.

However, typically, SPA and especially tomography specimens scatter inelastically and a lot of intensity moves from the zero-loss position to the plasmon region of 20 . . . 50 eV loss. This can be approximated by taking dE=50 eV. This leads to $$du \sim 50 \ eV/300 \ keV \times 10 \ \mu m = 17 \ \text{Å}.$$

This blur is too large and therefore interferes with the quality of a measurement.

It should be noted that the contribution of the normal chromatic aberration $du = dE/E \times C_c \times v$ is of comparable magnitude for $C_s = 2.7$ mm and $v = 5$ mrad. However, it is expected that this normal chromatic aberration adds significantly less background to the TEM image than the above estimated blur du~dE/E×s because of the relatively small amount of electrons scattered to $v \neq 0$.

From these two examples, it can be recognized, that the energy width dE must be reduced to below roughly 3 eV to keep the resolution loss below 1 Å if an image beam shift of 10 μm is applied.

Therefore, an energy filtering should be applied to the image beam, with an energy selecting window (that is, energy loss selecting window) below roughly 3 eV.

Note, that an energy filter can be optional for thinner samples or scanning electron microscopy. An energy filter is often present on electron microscopes to filter out electrons that are not in focus due to chromatic aberrations. The present disclosure present a way of using it to compensate for chromatic blur due to large image beam shifts. In this way, an additional use for an already present filter can be achieved.

The present invention is also defined by the following numbered embodiments.

Below is a list of method embodiments. Those will be indicated with a letter "M". Whenever such embodiments are referred to, this will be done by referring to "M" embodiments.

M1. A method for electron microscopy comprising
providing an electron microscope (1) comprising a sample component (2), at least one beam generator (4), at least one adjusting component (6, 8) and at least one diffraction correcting component (8, 10);
securing a sample by using the sample component (2);
generating an electron beam (12) by using the beam generator (4);
generating an image beam (14) by directing the beam (12) to the sample component (2);
adjusting at least one of the beam (12) and the image beam (14) by using the adjusting component (6,8) to obtain at least one modified image beam (16)
wherein the adjusting is performed in such a way, that off-axial aberrations inflicted on at least one of the beam (12) and the image beam (14) are minimized; and
correcting a diffraction pattern in the modified image beam (16) by using the diffraction correcting component (10).

M2. The method according to the preceding embodiment wherein adjusting at least one of the beam (12) and the image beam (14) by the adjusting component comprises at least one of shifting and tilting at least one of the beam (12) and the image beam (14) respectively.

M3. The method according to the preceding embodiment wherein both shifting and tilting are applied to at least one of the beam (12) and the image beam (14) and wherein the amount of tilting of at least one of the beam (12) and the image beam (14) depends on the amount of shifting of at least one of the beam (12) and the image beam (14) respectively.

M4. The method according to the preceding embodiment wherein the amount of tilting is computed based on at least one of coma and astigmatism introduced as a consequence of the shift.

M5. The method according to any of the preceding embodiments wherein the adjusting component (6,8) comprises at least one pair of deflectors, preferably two pairs of deflectors, the deflectors configured to deflect the electrons comprising at least one of the beam (12) and the image beam (14).

M6. The method according to any of the preceding method embodiments wherein the adjusting comprises at least shifting of up to 3 μm, preferably up to 5 μm, even more preferably up to 10 μm of at least one of the beam (12) and image beam (14).

M7. The method according to any of the preceding method embodiments wherein the adjusting comprises shifting and tilting the beam (12) and the image beam (14) and wherein the shift of the image beam (14) is substantially equal and opposite to the shift of the beam (12) and the tilt of the image beam (14) is substantially equal and opposite to the tilt of the beam (12).

M8. The method according to any of the preceding method embodiments wherein the diffraction correcting component (10) comprises an additional lens (10).

M9. The method according to the preceding embodiment wherein the diffraction correcting component (10) further comprises a double deflector unit (8).

M10. The method according to any of the two preceding embodiments wherein the additional lens (10) is configured to generate a magnified diffraction pattern.

M11. The method according to any of the three preceding embodiments and with the features of embodiments M2 and M9, wherein the double deflector unit (8) is configured to de-tilt at least one of the image beam (14) and the modified image beam (16).

M12. The method according to the preceding embodiment wherein the double deflector unit (8) is configured to shift and tilt the modified image beam (16) in a substantially equal and opposite way from the shifting and/or tilting of the beam (12) and the image beam (14) respectively.

M13. The method according to any of the preceding method embodiments wherein adjusting at least one of the beam (12) and image beam (14) and correcting a diffraction pattern is performed by the same component comprising at least one double deflector unit.

M14. The method according to any of the preceding embodiments wherein correcting the diffraction pattern in the modified image beam (16) comprises tilting the modified image beam (16) to center the diffraction pattern.

M15. The method according to any of the preceding method embodiments used to improve at least one of contrast and resolution in scanning transmission electron microscopy.

M16. The method according to the preceding embodiment wherein the adjusting component (6,8) comprises quadrupoles and wherein the electrostatic quadrupoles reduce astigmatism created by shifting at least one of the beam (12) and image beam (14).

M17: The method according to any of the two preceding embodiments wherein the diffraction correcting component (10) comprises scan coils.

M18. The method according to the preceding embodiment further comprising using the scan coils to tilt the beam (12) before directing it to the sample component (2) and de-tilting the image beam (14) below the sample component (2).

M19. The method according to any of the preceding method embodiments used to reduce throughput time in a sample image acquisition session in transmission electron microscopy.

M20. Use of the method according to any of the preceding method embodiments to improve at least one of contrast and resolution in tomography.

M21. Use of the method according to any of the preceding method embodiments on electron microscopes without inbuilt spherical aberration correction.

M22. A method for reducing throughput time in a sample image acquisition session in transmission electron microscopy comprising providing an electron microscope (1) comprising a sample component (2), at least one beam generator (4), at least one adjusting component (6,8), and at least one filtering component (20);

securing a sample by using the sample component (2);

generating an electron beam (12) by using the beam generator (4);

generating an image beam (14) by directing the beam (12) to the sample component (2);

adjusting at least one of the beam (12) and the image beam (14) by using the adjusting component (6,8) to obtain at least one modified image beam (16)

wherein the adjusting is performed in such a way, that off-axial aberration of the modified image beam (16) is minimized;

filtering the modified image beam (16) via the filtering component (20) to reduce resolution-deteriorating effect of chromatic aberration on the modified image beam (16) resulting from the adjusting of the at least one of the beam (12) and the image beam (14).

M23. The method according to the preceding embodiment wherein the adjusting is performed repeatedly to obtain a plurality of different modified image beams (16).

M24. The method according to any of the two preceding embodiments wherein adjusting at least one of the beam (12) and the image beam (14) by the adjusting component (6,8) comprises at least one of shifting and tilting at least one of the beam (12) and the image beam (14) respectively.

M25. The method according to the preceding embodiment wherein adjusting comprises at least one of a beam shift and an image shift as well as at least one of a beam tilt and an image tilt.

M26. The method according to the preceding embodiment wherein the amount of tilt applied during adjusting is dependent on the amount of at least one of beam shift or image shift respectively and wherein the specific amount of tilt applied reduces off-axial coma of the modified image beam (16).

M27. The method according to any of the preceding method embodiments M22 to M26 wherein the adjusting comprises shifting and tilting the beam (12) and the image beam (14) and wherein the shift of the image beam (14) is substantially equal and opposite to the shift of the beam (12) and the tilt of the image beam (14) is substantially equal and opposite to the tilt of the beam (12).

M28. The method according to any of the preceding method embodiments M22 to M27 used to reduce sample throughput time in single particle analysis.

M29. The method according to the preceding embodiment wherein the sample component (2) comprises a grid with a plurality of apertures, each configured to receive a foil of ice with the sample.

M30. The method according to any of the preceding embodiments M22 to M29 and with the features of embodiments M25 and M28 wherein "stage shift" refers to physically moving the sample component (2) (12) so that a different part of the sample can be imaged and wherein the throughput time of sample image acquisition is reduced by decreasing the number of stage shifts and increasing the number of at least one of beam and image shifts performed in the sample image acquisition session.

M31. The method according to the preceding embodiment wherein the number of at least one of beam shifts and image shifts taken without applying a stage shift comprises at least 10 shifts, preferably at least 20 shifts, such as at least 25 shifts.

M32. The method according to any of the preceding embodiments M22 to M31 and with the features of embodiment M30 further comprising increasing the distance of at least one of beam shifts and image shifts.

M33. The method according to the preceding embodiment wherein the distance of the at least one of beam shifts and image shifts is increased by at least 2 times, preferably at least 3 times, more preferably at least 5 times as compared to standard single particle analysis shift distance of about 1-2 μm.

M34. The method according to any of the preceding embodiments M22 to M33 and with the features of embodiment M25 wherein the tilt t applied to the beam (12) is related to the shift s applied to the image beam (14) as $t=-K \cdot s/Cs$, where K denotes off-axial coma and Cs denotes spherical aberration.

M35. The method according to any of the preceding embodiments M22 to M34 wherein the filtering component (20) comprises an electron energy filter.

M36. The method according to the preceding embodiment wherein the filtering component (20) filters out electrons with an energy loss above 10 eV, preferably above 5 eV, more preferably above 3 eV.

Below is a list of device embodiments. Those will be indicated with a letter "A". Whenever such embodiments are referred to, this will be done by referring to "A" embodiments.

A1. An electron microscope (1) comprising
a sample component (2) configured to receive a sample;
at least one beam generator (4) configured to generate an electron beam (12)
wherein the beam (12) is configured to generate an image beam (14) upon being directed to the sample component (2);
at least one adjusting component (6,8) configured to adjust at least one of the beam (12) and the image beam (14) to obtain at least one modified image beam (16)
wherein the adjusting component is further configured to minimize off-axial aberration inflicted on at least one of the beam (12) and the image beam (14); and
at least one diffraction correcting component (10) configured to correct a diffraction pattern in the modified image beam (16) resulting from at least one of beam and image shifts.

A2. The electron microscope (1) according to the preceding embodiment configured to carry out the method according to any of the method embodiments.

A3. The electron microscope (1) according to any of the preceding device embodiments configured for transmission electron microscopy, preferably for single particle analysis.

A4. The electron microscope (1) according to any of the preceding device embodiments wherein the sample component (2) comprises a grid with a plurality of apertures configured to receive a foil of ice with the sample.

A6. The electron microscope (1) according to any of the preceding device embodiments wherein the adjusting component (6,8) comprises at least one pair of deflectors configured to generate at least one electromagnetic field each.

A7. The electron microscope (1) according to the preceding embodiment, wherein the adjusting component (6,8) comprises at least one pair of deflectors, preferably two pairs of deflectors, the deflectors configured to deflect the electrons comprising at least one of the beam (12) and the image beam (14).

A8. The electron microscope (1) according to any of the preceding device embodiments wherein the adjusting component (6,8) is configured to at least one of shift and tilt at least one of the beam (12) and the image beam (14) respectively.

A9. The electron microscope (1) according to any of the preceding device embodiments, wherein the adjusting component (6, 8) comprises at least a pair of beam deflectors (6) and a pair of image deflectors (8), each pair configured to at least one of shift and tilt the beam (12) and the image beam (14) respectively.

A10. The electron microscope (1) according to the preceding embodiment wherein the adjusting component (6,8) is configured to apply at least one of a beam shift and an image shift as well as at least one of a beam tilt and an image tilt.

A11. The electron microscope (1) according to the preceding device embodiment wherein the adjusting component (6,8) is configured to apply a variable amount of tilt based on the amount of shift applied to at least one of the beam (12) and the image beam (14).

A12. The electron microscope (1) according to the preceding embodiment wherein the adjusting component (6,8) is configured to shift and tilt the beam (12) and the image beam (14) and wherein
the shift of the image beam (14) is substantially equal and opposite to the shift of the beam (12) and
the tilt of the image beam (14) is substantially equal and opposite to the tilt of the beam (12).

A13. The electron microscope (1) according to any of the preceding device embodiments wherein the diffraction correcting component (10) comprises an additional lens (10) and a double deflector unit (8).

A14. The electron microscope (1) according the preceding embodiment wherein the additional lens (10) is configured to generate a magnified diffraction pattern.

A15. The electron microscope (1) according to any of the two preceding embodiments and with the features of embodiment A8, wherein the double deflector unit (8) is configured to de-tilt the modified image beam (16).

A16. The electron microscope (1) according to any of the preceding device embodiments further comprising a filtering component (20) configured to filter the modified image beam (16).

A17. The electron microscope (1) according to the preceding embodiment wherein the filtering component (20) is configured to reduce resolution-deteriorating effect of chromatic aberration on the modified image beam (16).

A18. The electron microscope (1) according to any of the two preceding embodiments wherein the filtering component (20) comprises an electron energy filter.

A19. The electron microscope (1) according to the preceding embodiment wherein the filtering component (20) is configured to filter out electrons with an energy loss above 10 eV, preferably above 5 eV, more preferably above 3 eV.

A20. The electron microscope (1) according to any of the preceding device embodiments configured to operate without an inbuilt image corrector introducing a shift-dependent tilt to reduce off-axial coma.

Below is a list of system embodiments. Those will be indicated with a letter "S". Whenever such embodiments are referred to, this will be done by referring to "S" embodiments.

S1. A non-transient computer-readable medium with a computer program for carrying out the method for transmission electron microscopy according to any of the preceding method embodiments.

The present technology will now be discussed with reference to the accompanying drawings.

DESCRIPTION OF EMBODIMENTS

Figure 1A:
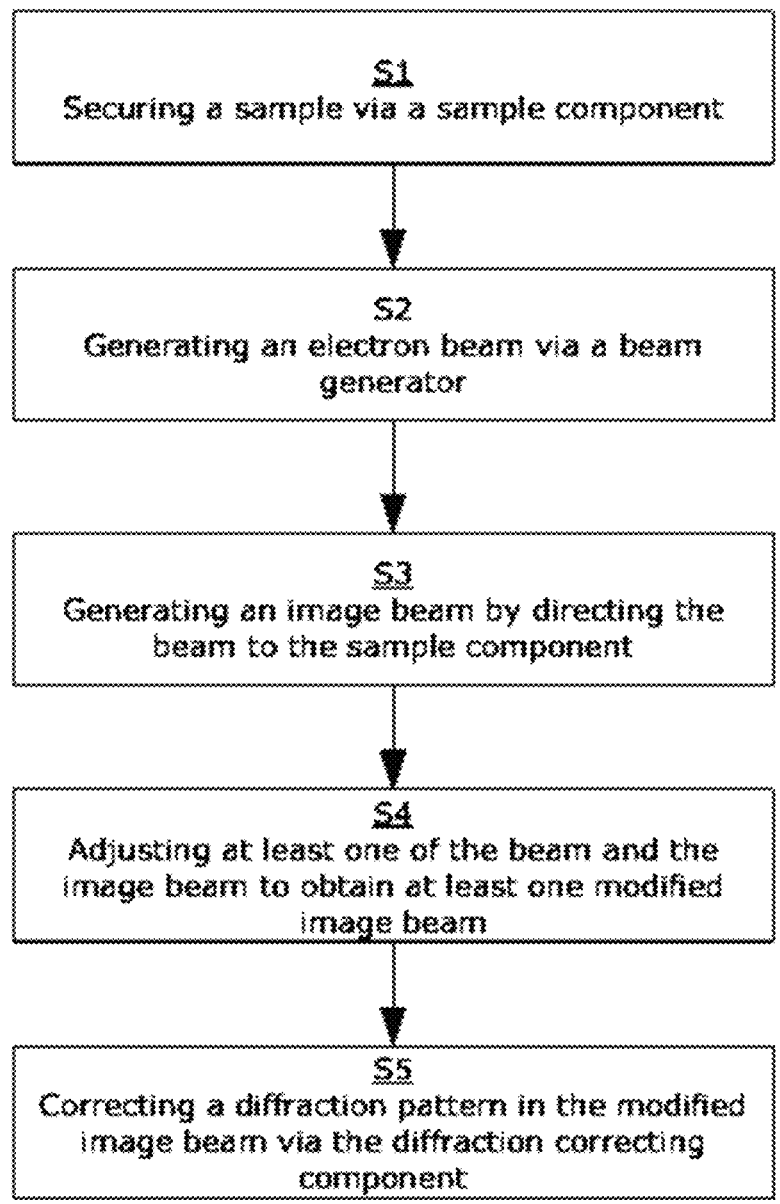
FIGS. 1a and 1b schematically depict the steps of the methods according to two embodiments of the invention.

FIG. 1a schematically depicts an embodiment of a method according to the invention. The method can be preferably executed by an electron microscope. The electron microscope can be a transmission or a scanning microscope. The applications of the method can be to various branches of electron microscopy such as TEM, STEM, SPA, Tomography and others.

The order of the steps as described here, in the claims, and in the rest of the application can be variable, and the method can be applied with the steps performed in a different order.

In step S1, a sample can be secured via a sample component. That is the sample can be placed on a sample/specimen plate or grid. The sample can also be prepared in a certain way, such as encased in vitrified ice. In single particle analysis, the specimen can be placed on a grid comprising a plurality of holes, each containing a foil of ice with the sample molecule encased in it.

In step S2, an electron beam can be generated via a beam generator. Various method of providing a beam for electron microscopy are known in the art.

In step S3, an image beam can be generated by directing the beam to the sample component. That is, in the case of transmission electron microscopy, the beam can pass through the sample secured via the sample component. In the case of scanning electron microscopy, the beam can hit the surface of the sample secured via the sample component.

In step S4, at least one of the beam and the image beam can be adjusted to obtain at least one modified image beam. That is, either or both of the beam and image beam can be shifted and/or tilted by using electron deflectors. This can result in a horizontally displaced imaging area. The shift can be larger than those previously used in electron microscopy. That is, a beam/image beam shift of up to about 10 µm (as compared to the typical 1-2 µm) can be achieved. The modified image beam can then comprise a different part of the sample as compared to the image beam (the previous image beam). Preferably both a shift and a tilt are used.

The adjustment can be done is such a way, so as to reduce off-axial aberration in the beam, the image beam and/or the modified image beam. For example, the applied tilt can be dependent on the applied shift so as to maximally reduce off-axial aberration.

Large image beam shifts can lead to increased off-axial aberration (such as off-axial coma), which then needs to be corrected to obtain an image that is in focus. Off-axial coma can generally be corrected by implementing specialized software that makes tilt corrections to the beam and/or image beam depending on the shift that has been applied on the beam/image beam.

In step S5, a diffraction pattern in the modified image beam can be corrected. This correction can be done in various ways. In STEM, electrostatic quadrupoles can be used to make scan-dependent stigmator corrections. In Themis microscopes, scan coils below the sample can be used for de-tilting the beam after a large image beam shift, thereby reducing off-axial aberration. In SPA, but also in STEM or TEM, an additional electromagnetic lens with a double deflector unit can be placed between the objective lens and the projector system. The additional lens can be used to "de-tilt" (that is, undo the effects of the previous tilt) the shifts of the diffraction pattern while making coma-free image beam shifts.

Figure 1B:
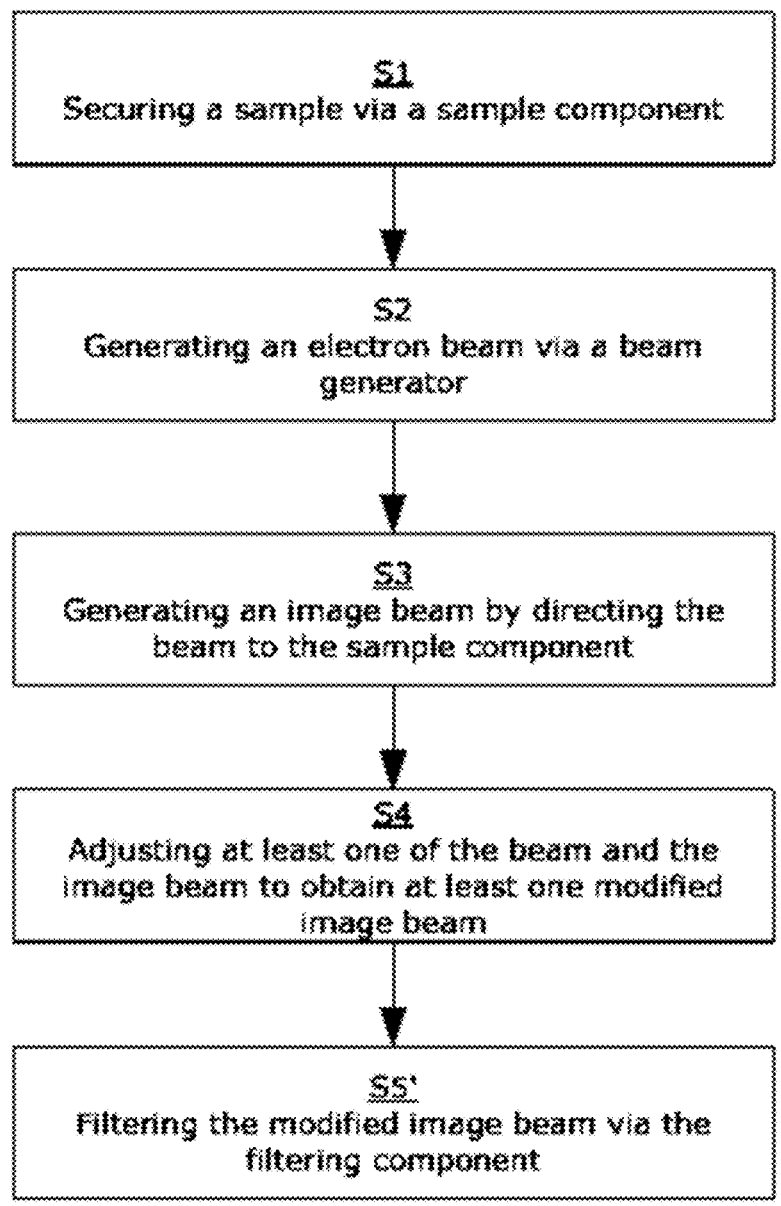

FIG. 1b schematically depicts an embodiment of a slightly different method according to one embodiment of the invention. This method is preferably used in transmission electron microscopy, as opposed to the previous one, which can be used in both TEM and STEM. Steps S1 to S4 of the present method are the same and steps S1 to S4 of the previous method depicted in FIG. 1a and described above.

In step S5', the modified image beam is filtered via the filtering component. This is done to avoid blur due to the electrons scattering inelastically on the constituents of the sample. This filtering is not necessary in STEM, but plays a significant role in TEM, as it allows to keep resolution loss due to (off-axial) chromatic aberrations low while applying large shifts to the beam and/or image beam.

Figure 2A:
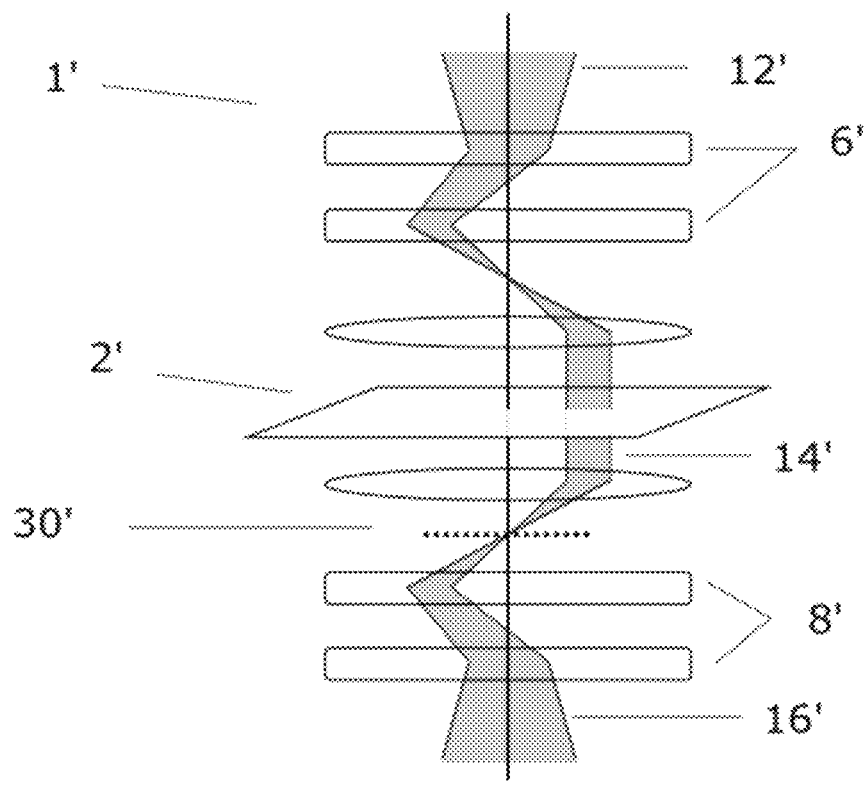
FIGS. 2a and 2b depict an embodiment of an electron microscope according to prior art.
Figure 2B:
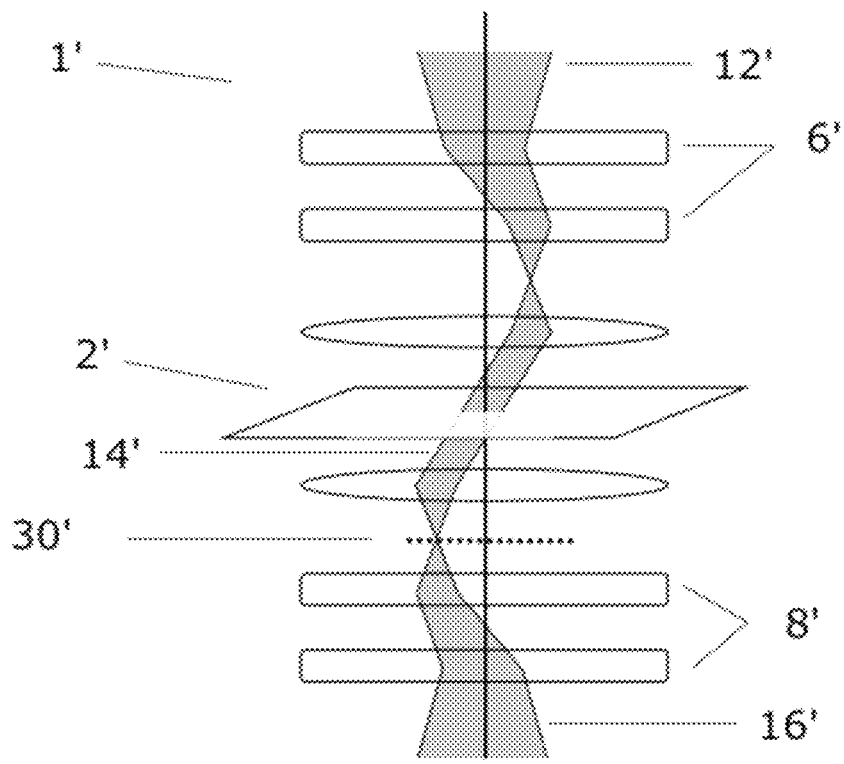

FIGS. 2a and 2b schematically depict an electron microscope 1' according to the prior art. Both figures depict a sample component 2' and adjusting component 6', 8' (depicted as two pairs of deflectors 6' and 8'). Beam 12' is shown being adjusted by the adjusting component 6', 8'. Image beam 14' and modified image beam 16' are also depicted.

In FIG. 2a, a shift of the beam 12' is shown. That is, the beam 12' is deflected by the adjusting component 6'. The image beam 14' still passes through the optical center of back focal plane 30'.

In FIG. 2b, a tilt of the beam 12' is shown. That is, the beam 12' is tilted by the adjusting component 6'. The image beam 14' does not pass through the optical center of the back focal plane 30'.

Figure 3:
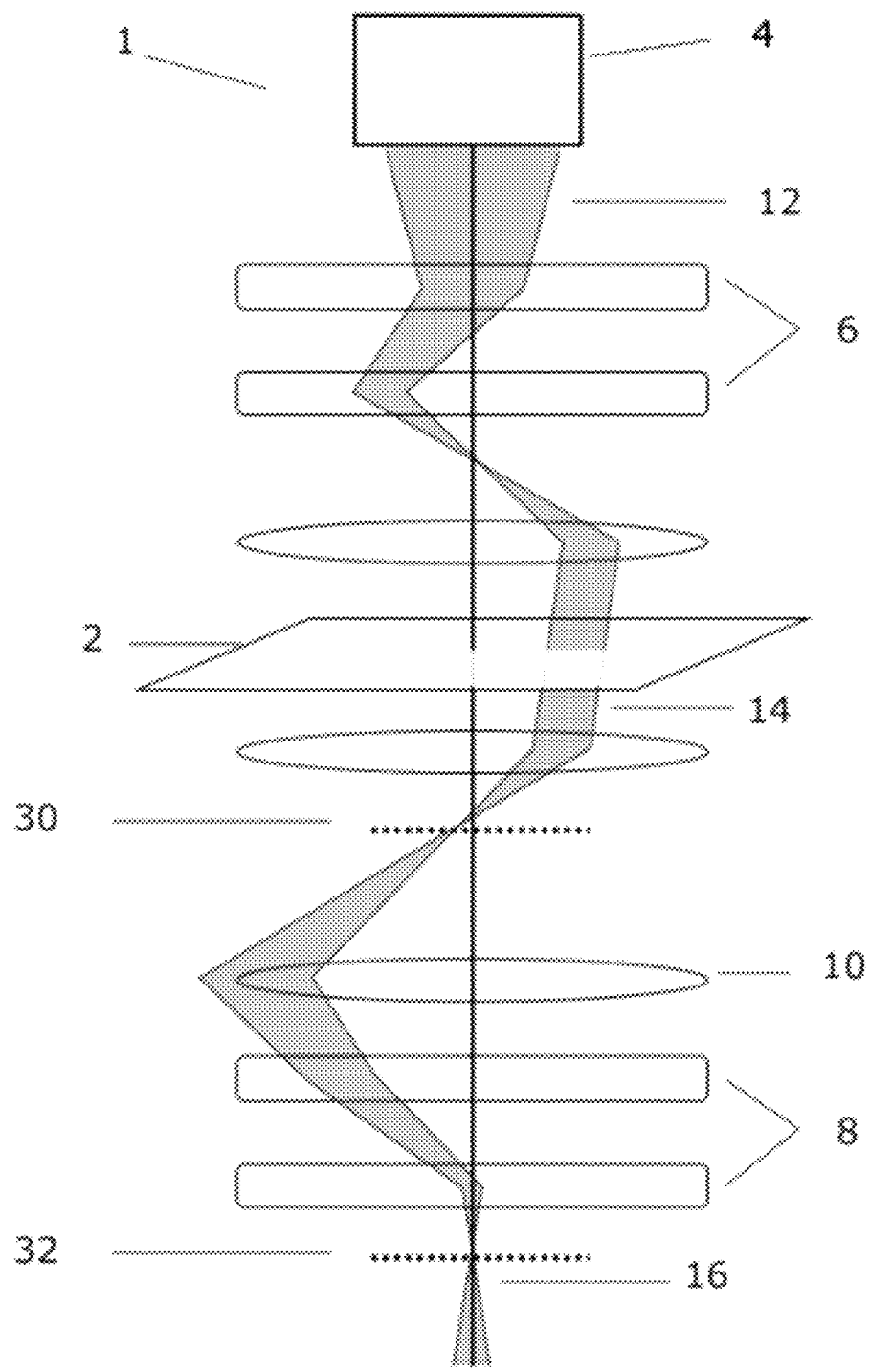
FIG. 3 depicts an embodiment of an electron microscope according to one embodiment of the invention and configured to execute the inventive method.

FIG. 3 depicts an electron microscope 1 according to one embodiment of the invention. The electron microscope 1 can comprise a sample component 2 where a sample or a specimen can be placed and/or secured. The sample component 2 can comprise a plate, a grid with a plurality of holes, or another component typical in electron microscopy.

Also depicted in the figure is a beam generator 4. The beam generator 4 can provide an electron beam. The beam generator 4 can comprise an electron gun or another typical electron beam generator. Adjusting components 6, 8 are depicted as beam deflection coils and image beam deflection coils. The adjusting component 6, 8 can shift and/or tilt beam 12 and/or image beam 14. A diffraction correcting component 10 is depicted as an additional lens 10 on the present figure. They can be used to shift the image beam back to the optical axis, as well as to de-tilt the image beam. The coils 6 can additionally or alternatively be used to generate a Zemlin tableau which can in turn be used to quantify aberration coefficients and to minimize them by software. Particularly, spherical aberration can be corrected by when the microscopes is equipped with a built-in Cs corrector. However, the diffraction correcting component 10 can also comprise an additional electromagnetic lens 10 configured to create an intermediate image of back-focal plane 32 in order to place a phase plate.

The beam 12 emitted by the beam generator 4 is referred to as image beam 14 upon passing through the sample component 2. The image beam 14 is further modified to yield a modified image beam 16 (depicted in the present figure after additional adjusting by deflectors 8 and after the back focal plane 32.

The electron microscope as depicted in FIG. 3 can be preferably used for STEM or TEM analysis. Since the figure is schematic, further pieces of equipment are not shown or numbered (such as further lenses for magnification and/or focusing of the beam, the image beam, the modified image beam and/or further components).

Figure 4:
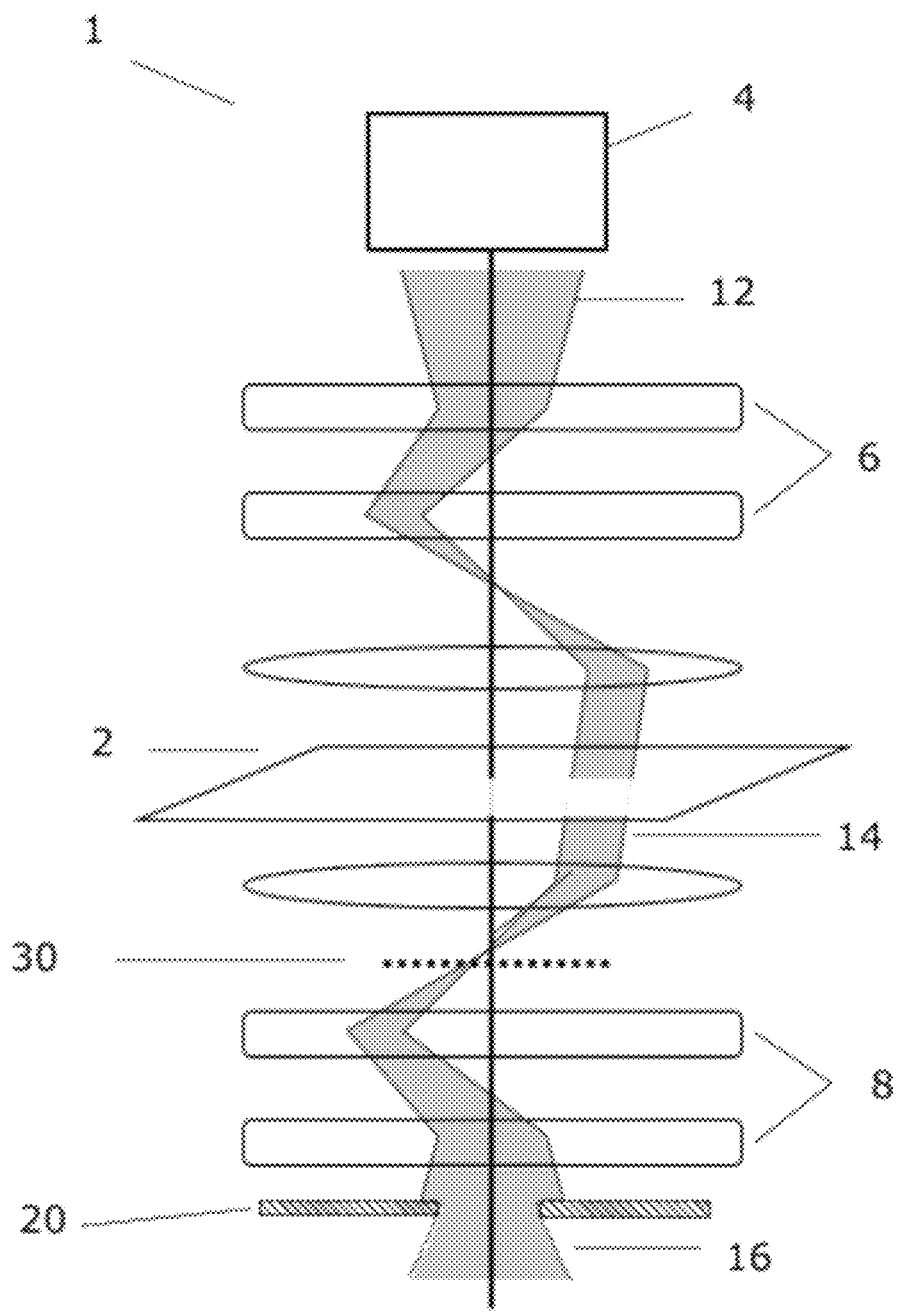
FIG. 4 depicts another embodiment of an electron microscope according to the invention and configured to execute the inventive method.

FIG. 4 depicts another schematic embodiment of an electron microscope 1. Preferably, it can be used for single particle analysis in TEM. As before, the beam generator 4 produces a beam 12. The beam 12 is then adjusted by the adjusting component 6, 8. In the depicted case, beam deflectors 6 apply a shift and a tilt to the beam, resulting in skew illumination. The skewed beam 12 then passes through the sample component 2, resulting in an image beam 14. The image beam 14 is then filtered by a filtering component 20. The filtering component 20 can comprise an adjustable slit that only lets electrons of certain energies pass. For example, electrons with an energy loss of approximately below 3 eV can be allowed to pass, to avoid image blurriness due to inelastic electron scattering. After filtering, the image beam 14 hits the back focal plane 30 off-center. It is then further adjusted by the deflectors 8 to return to the optical center and result in the modified image beam 16. Note, that the filtering component 20 is depicted and described in the present application only schematically. It is described in detail in the applicant's European patent application EP 2 388 796 A1, incorporated herein by reference.

Figure 5A:
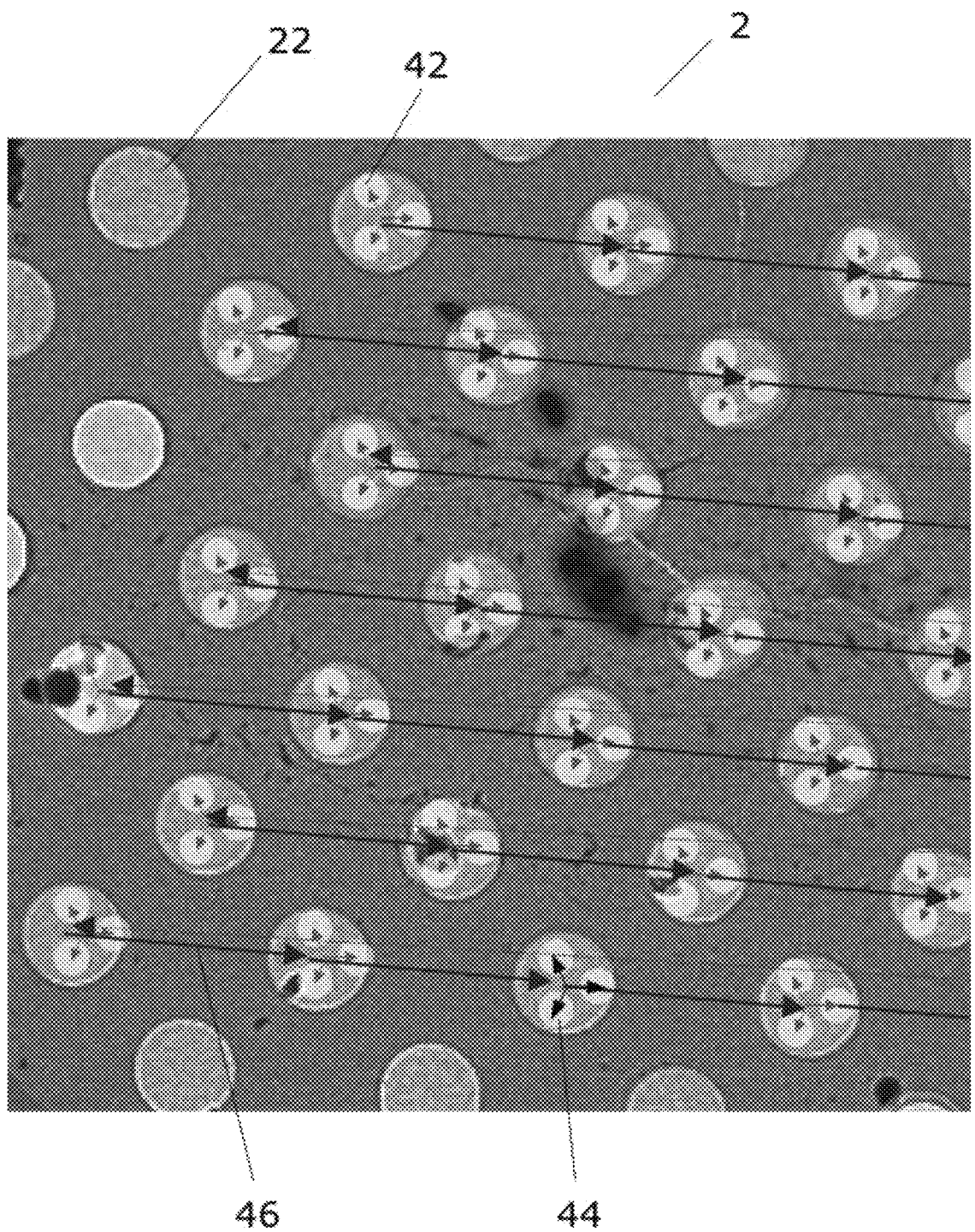
FIG. 5a depicts a prior art method for single particle analysis in electron microscopy.
Figure 5B:
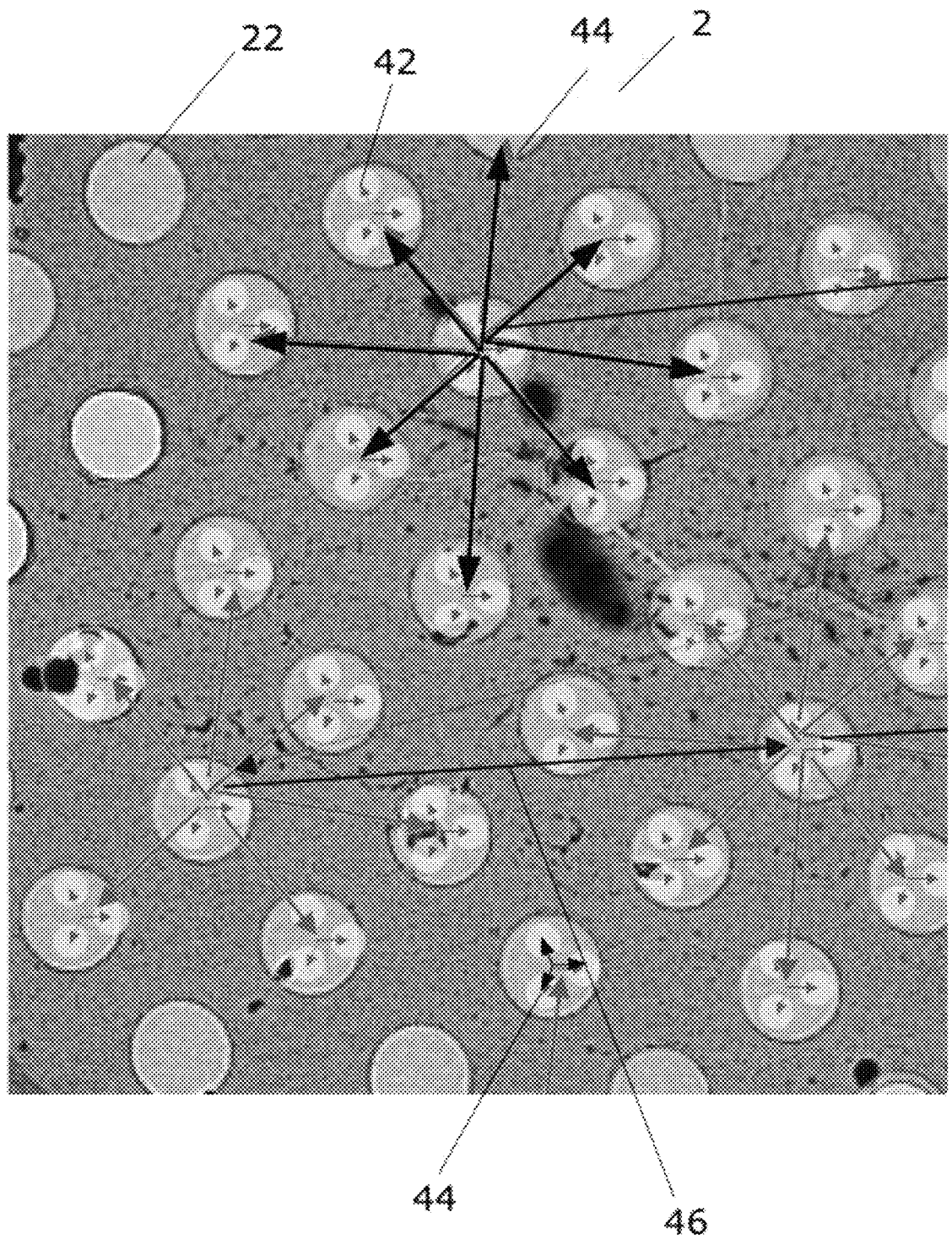
FIG. 5b depicts a method for single particle analysis according to an embodiment of the invention.

FIGS. 5a and 5b schematically depicts a sample component 2, preferably used in single particle analysis. The sample component 2 can comprise a plurality of holes or apertures 22. The holes 22 can house a sample or specimen encased in ice foils.

FIG. 5a shows a previously known way of obtaining a plurality of sample images, that is, the prior art. Image acquisitions 42, shown as smaller circles in the holes 22 depict the area imaged by a particular beam/image orientation. Small pale arrows correspond to image beam shifts 44, typically performed on a small scale within one hole in the prior art. The image beam shifts 44 are highlighted in black in one of the holes to make them easier to locate. Longer arrows that connect different holes 22 correspond to stage moves 46. The stage moves 46 are typically used in the prior art to obtain images of a different hole 22 of the sample grid. The stage moves 46 typically take about 20-60 seconds to perform, leading to undesirably increased acquisition times for single particle analysis. Image beam shifts, on the other hand, take about 1 second to perform.

In FIG. 5a, three images acquired with an electron microscope take about 1 stage movement (about 30 seconds), 3 image beam shifts (about 3*1 seconds) and 3 exposures (about 3*4 seconds). Therefore, the average acquisition time per image is about 15 seconds.

FIG. 5b depicts the presently disclosed inventive way of performing single particle analysis. Image beam shifts 44, now depicted by longer pale arrows can be used to image all or a plurality of neighboring holes 22 starting from a central one. This can be achieved by enabling larger image beam shifts which were previously not possible for single particle analysis. Advantageously, the number of stage moves 46 can be significantly reduced. This can lead to a much improved acquisition time in single particle analysis. The method of FIG. 3b is also preferably performed with dynamic correction of coma, astigmatism and defocus, as well as energy filtering (for some cases, for example SPA).

In FIG. 5b, acquiring 27 images takes approximately 1 stage movement (about 30 seconds), 27 image beam shifts (about 27*1 second), 27 exposures (about 27*4 seconds). This yields an average time of 6 seconds per image, significantly increasing the throughput time of a sample.

Figure 6:
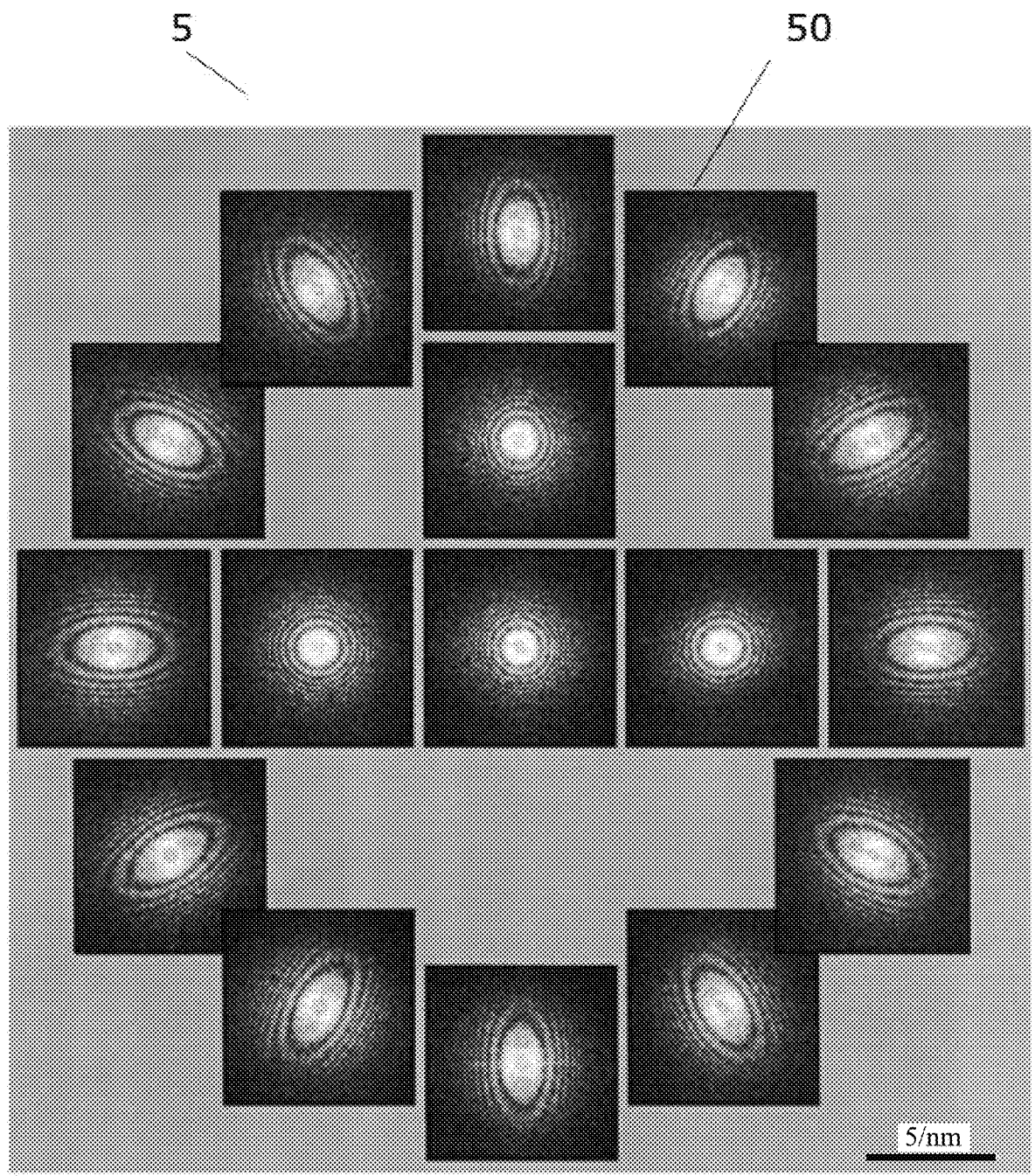
FIG. 6 depicts an exemplary embodiment of a Zemlin tableau used to compute aberration coefficients of the obtained images.

FIG. 6 depicts an exemplary embodiment of a Zemlin tableau. The Zemlin tableau comprises a plurality of subgraphs 50 which are each Fourier transforms of different TEM images taken by tilting the incident beam around the optical axis through a series of azimuthal angles. As depicted in the figure, the positions at which each of the subgraphs 50 are plotted in the Zemlin tableau 5 correspond to the tilt applied to the incident beam used to record each of the TEM images of which each of the subgraph shows the Fourier transform. That is, the central subgraph corresponds to an image taken without any tilt, while the top one corresponds to an image taken with a tilt in this direction with respect to the central image and when looking from above. From the different subgraphs 50, aberration coefficients can be calculated and then implemented in correcting software. This is further explained above when discussing the Zemlin tableau. The different tilts result in different first order aberrations, which can be analyzed with specialized software to derive all aberrations (and not just first order ones), including the on-axial coma.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be the preferred order, but it may not be mandatory to carry out the steps in the recited order. That is, unless otherwise specified or unless clear to the skilled person, the order in which steps are recited may not be mandatory. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

What is claimed is:

1. A method for electron microscopy comprising:
providing an electron microscope comprising a sample component, a beam generator, and a beam adjusting component;
securing a sample by using the sample component;
generating an electron beam by using the beam generator;
generating an image beam by directing the electron beam to the sample component; and
adjusting at least one of the electron beam and the image beam in such a way that off-axial aberrations inflicted on at least one of the electron beam and the image beam are minimized, the adjusting performed by using the beam adjusting component to obtain at least one modified image beam, wherein the adjusting comprises applying both shifting and tilting to at least one of the electron beam and the image beam and wherein the amount of tilting of at least one of the electron beam and the image beam depends on the amount of shifting of at least one of the electron beam and the image beam respectively and wherein the amount of tilting is computed based on at least one of coma and astigmatism introduced as a consequence of the shift.

2. The method of claim 1, wherein the adjusting comprises at least shifting of up to 3 µm, or up to 5 µm, or up to 10 µm of at least one of the electron beam and image beam.

3. The method of claim 1, wherein the adjusting comprises shifting and tilting the electron beam and the image beam and wherein
the shift of the image beam is substantially equal and opposite to the shift of the electron beam; and
the tilt of the image beam is substantially equal and opposite to the tilt of the electron beam.

4. The method of claim 1, wherein the providing of the beam adjusting component comprises providing a beam adjusting component comprising electrostatic quadrupoles, wherein the electrostatic quadrupoles reduce astigmatism created by shifting at least one of the electron beam and image beam.

5. An electron microscope comprising:
a sample component configured to receive a sample;
a beam generator configured to generate an electron beam;
wherein the electron beam is configured to generate an image beam upon being directed to the sample component;
a beam adjusting component configured to adjust at least one of the electron beam and the image beam to obtain at least one modified image beam, the beam adjusting component comprising at least a pair of beam deflectors and a pair of image deflectors, each pair configured to at least one of shift and tilt the electron beam and the image beam respectively;
wherein the beam adjusting component is further configured to minimize off-axial aberration inflicted on at least one of the electron beam and the image beam by adjusting at least one of the electron beam and the image beam to obtain at least one modified image beam, the adjusting comprising applying both shifting and tilting to at least one of the electron beam and the image beam, wherein the amount of tilting of at least one of the electron beam and the image beam depends on the amount of shifting of at least one of the electron beam and the image beam respectively and wherein the amount of tilting is computed based on at least one of coma and astigmatism introduced as a consequence of the shift.

6. The electron microscope of claim 5, wherein the beam adjusting component is configured to shift and tilt the electron beam and the image beam and wherein
the shift of the image beam is substantially equal and opposite to the shift of the electron beam and
the tilt of the image beam is substantially equal and opposite to the tilt of the electron beam.

7. The electron microscope of claim 5, configured to operate without an inbuilt image corrector introducing a shift-dependent tilt to reduce off-axial coma.

8. The electron microscope of claim 5, wherein the beam adjusting component comprises electrostatic quadrupoles that are configured to reduce astigmatism created by shifting at least one of the beam and image beam.

9. A method for electron microscopy comprising:
adjusting at least one of an electron beam and an image beam in such a way that off-axial aberrations inflicted on at least one of the electron beam and the image beam are minimized,
wherein the adjusting is performed by using a beam adjusting component to obtain at least one modified image beam wherein the adjusting comprises applying both shifting and tilting to at least one of the electron beam and the image beam, and
wherein the amount of tilting of at least one of the electron beam and the image beam depends on the amount of shifting of at least one of the electron beam and the image beam respectively and wherein the amount of tilting is computed based on at least one of coma and astigmatism introduced as a consequence of the shift.

\* \* \* \* \*